(12) United States Patent
Sakaue et al.

(10) Patent No.: US 11,500,793 B2
(45) Date of Patent: Nov. 15, 2022

(54) MEMORY SYSTEM

(71) Applicant: Kioxia Corporation, Tokyo (JP)

(72) Inventors: Kenji Sakaue, Yokohama (JP);
Toshiyuki Furusawa, Tokyo (JP);
Shinya Takeda, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/158,134

(22) Filed: Jan. 26, 2021

(65) Prior Publication Data

US 2021/0406204 A1   Dec. 30, 2021

(30) Foreign Application Priority Data

Jun. 29, 2020   (JP) .............................. JP2020-111105

(51) Int. Cl.
| | |
|---|---|
| *G06F 13/16* | (2006.01) |
| *G06F 13/40* | (2006.01) |
| *G06F 13/42* | (2006.01) |
| *H01L 25/065* | (2006.01) |
| *H01L 25/18* | (2006.01) |
| *H01L 23/00* | (2006.01) |

(52) U.S. Cl.
CPC ...... *G06F 13/1668* (2013.01); *G06F 13/4022* (2013.01); *G06F 13/4282* (2013.01); *H01L 23/562* (2013.01); *H01L 25/0657* (2013.01); *H01L 25/18* (2013.01); *H01L 2225/0652* (2013.01); *H01L 2225/06513* (2013.01); *H01L 2225/06517* (2013.01); *H01L 2225/06541* (2013.01); *H01L 2225/06586* (2013.01)

(58) Field of Classification Search
CPC ............ G06F 13/1668; G06F 13/4022; G06F 13/4282; H01L 33/562; H01L 25/18; H01L 25/0657
See application file for complete search history.

(56) References Cited

U.S. PATENT DOCUMENTS

| | | | |
|---|---|---|---|
| 5,898,223 A | 4/1999 | Frye et al. | |
| 8,922,243 B2 * | 12/2014 | Jayasena | ............. G06F 13/4234 326/39 |
| 9,286,960 B2 * | 3/2016 | Takeyama | ............... G11C 16/20 |
| 9,697,147 B2 * | 7/2017 | Loh | ...................... G06F 11/1004 |

(Continued)

FOREIGN PATENT DOCUMENTS

| | | |
|---|---|---|
| CN | 102136292 A | 7/2011 |
| TW | 414982 B | 12/2000 |

(Continued)

*Primary Examiner* — Henry Tsai
*Assistant Examiner* — Christopher A Daley
(74) *Attorney, Agent, or Firm* — Oblon, McClelland, Maier & Neustadt, L.L.P.

(57) ABSTRACT

According to one embodiment, a memory system includes a first chip and a second chip. The second chip is bonded with the first chip. The memory system includes a semiconductor memory device and a memory controller. The semiconductor memory device includes a memory cell array, a peripheral circuit, and an input/output module. The memory controller is configured to receive an instruction from an external host device and control the semiconductor memory device via the input/output module. The first chip includes the memory cell array. The second chip includes the peripheral circuit, the input/output module, and the memory controller.

32 Claims, 20 Drawing Sheets

(56) References Cited

U.S. PATENT DOCUMENTS

| | | | |
|---|---|---|---|
| 9,955,097 B2 | 4/2018 | Iwabuchi et al. | |
| 9,990,143 B2 * | 6/2018 | Lee | G06F 3/0622 |
| 10,037,946 B2 * | 7/2018 | Hu | H01L 25/18 |
| 10,268,387 B2 * | 4/2019 | Cr | G06F 3/0659 |
| 10,522,489 B1 * | 12/2019 | Takiar | H01L 24/73 |
| 11,200,165 B2 * | 12/2021 | Ko | G06F 12/0802 |
| 11,216,393 B2 * | 1/2022 | Guo | H01L 23/481 |
| 2010/0070696 A1 | 3/2010 | Blankenship | |
| 2011/0161583 A1 | 6/2011 | Youn | |
| 2015/0131397 A1 * | 5/2015 | Takeyama | H01L 25/0657 |
| | | | 365/230.03 |
| 2015/0301755 A1 * | 10/2015 | Chodem | G06F 3/065 |
| | | | 714/764 |
| 2015/0331626 A1 * | 11/2015 | Avila | G06F 12/0638 |
| | | | 711/103 |
| 2018/0174996 A1 | 6/2018 | Mostovoy et al. | |
| 2019/0043836 A1 | 2/2019 | Fastow et al. | |
| 2019/0121755 A1 | 4/2019 | Yang | |

FOREIGN PATENT DOCUMENTS

| | | |
|---|---|---|
| TW | 201917590 A | 5/2019 |
| WO | WO 2006/129762 A1 | 12/2006 |

\* cited by examiner

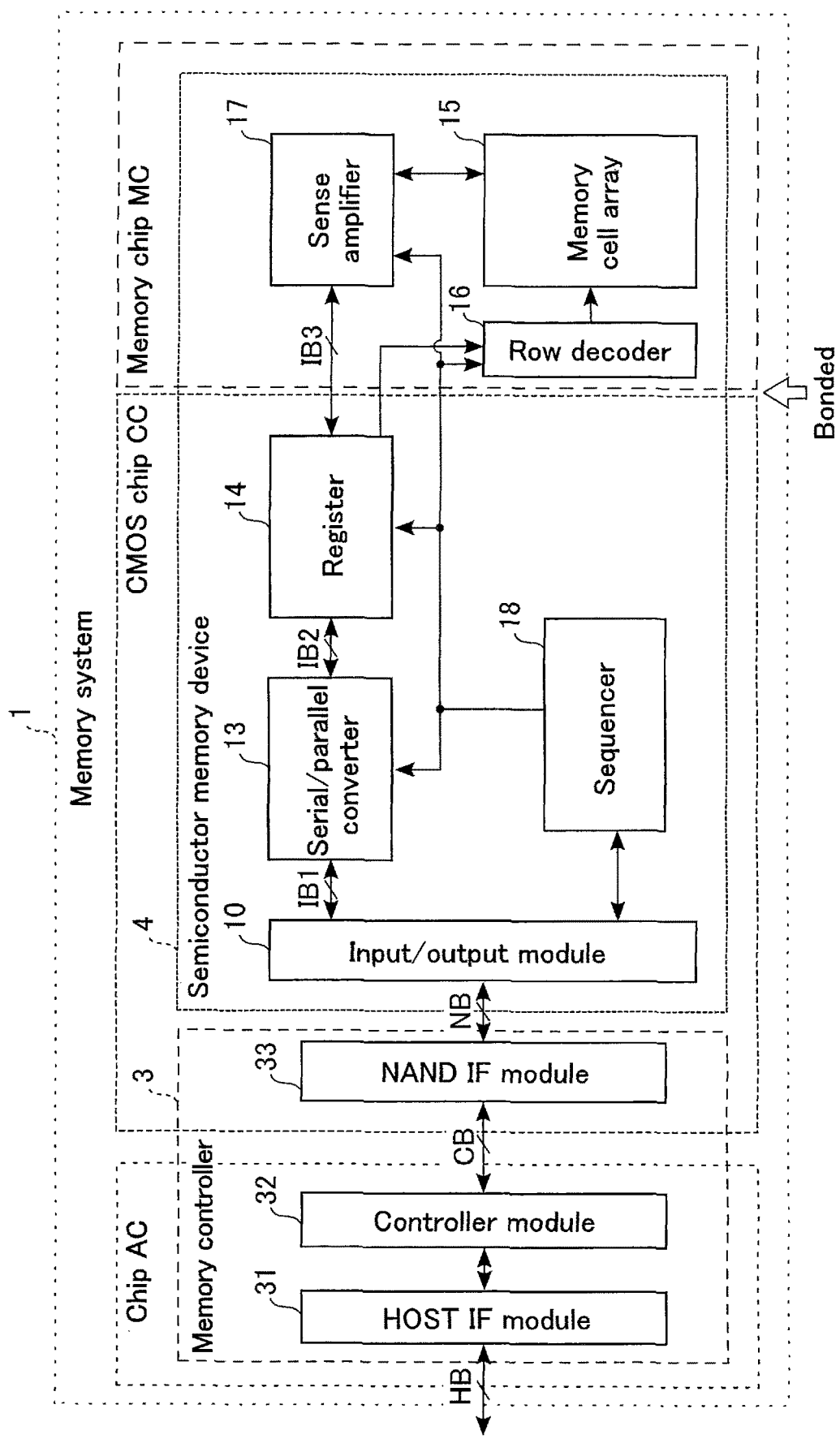
F I G. 9

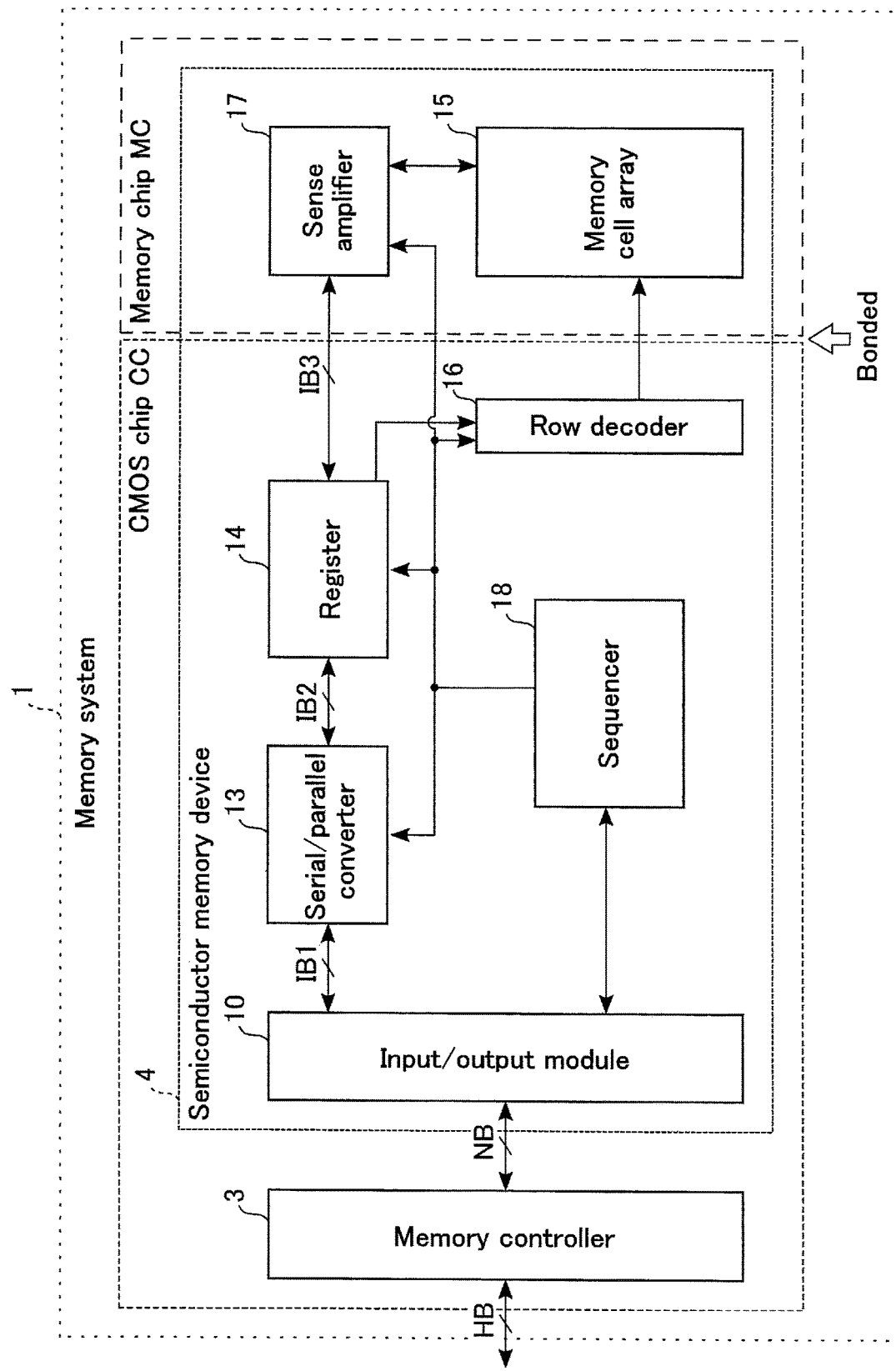
F I G. 11

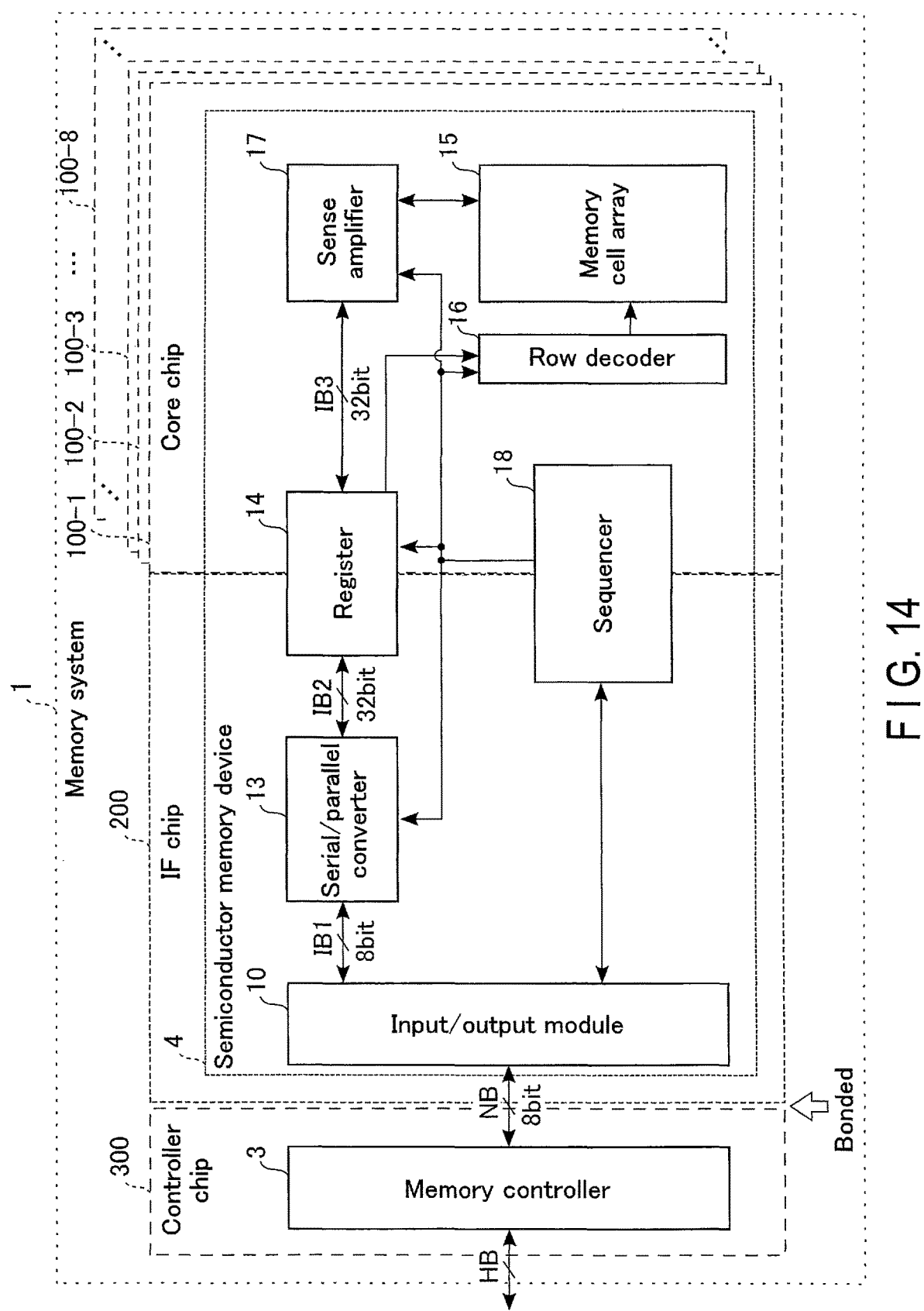
F I G. 14

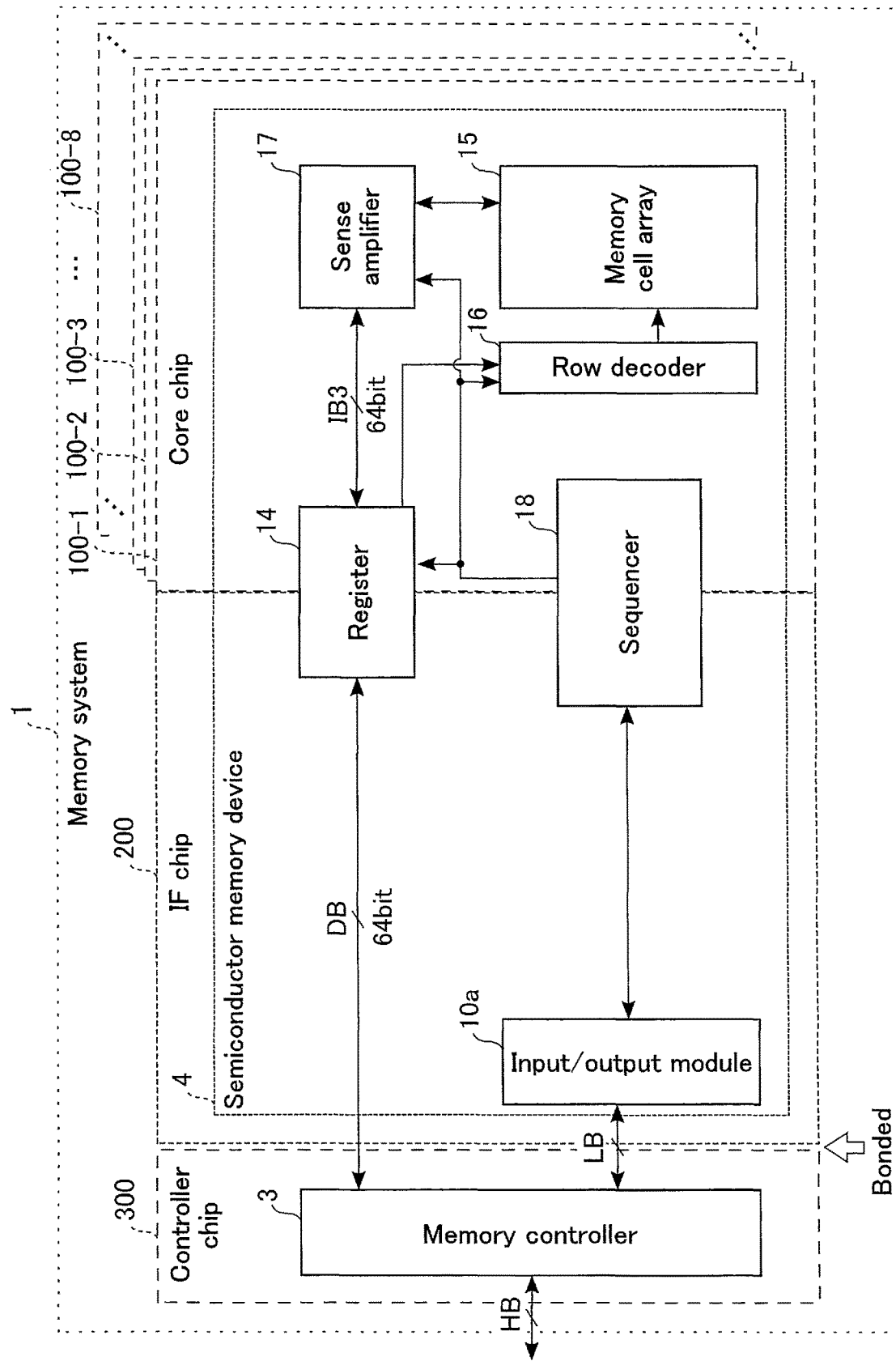
F I G. 16

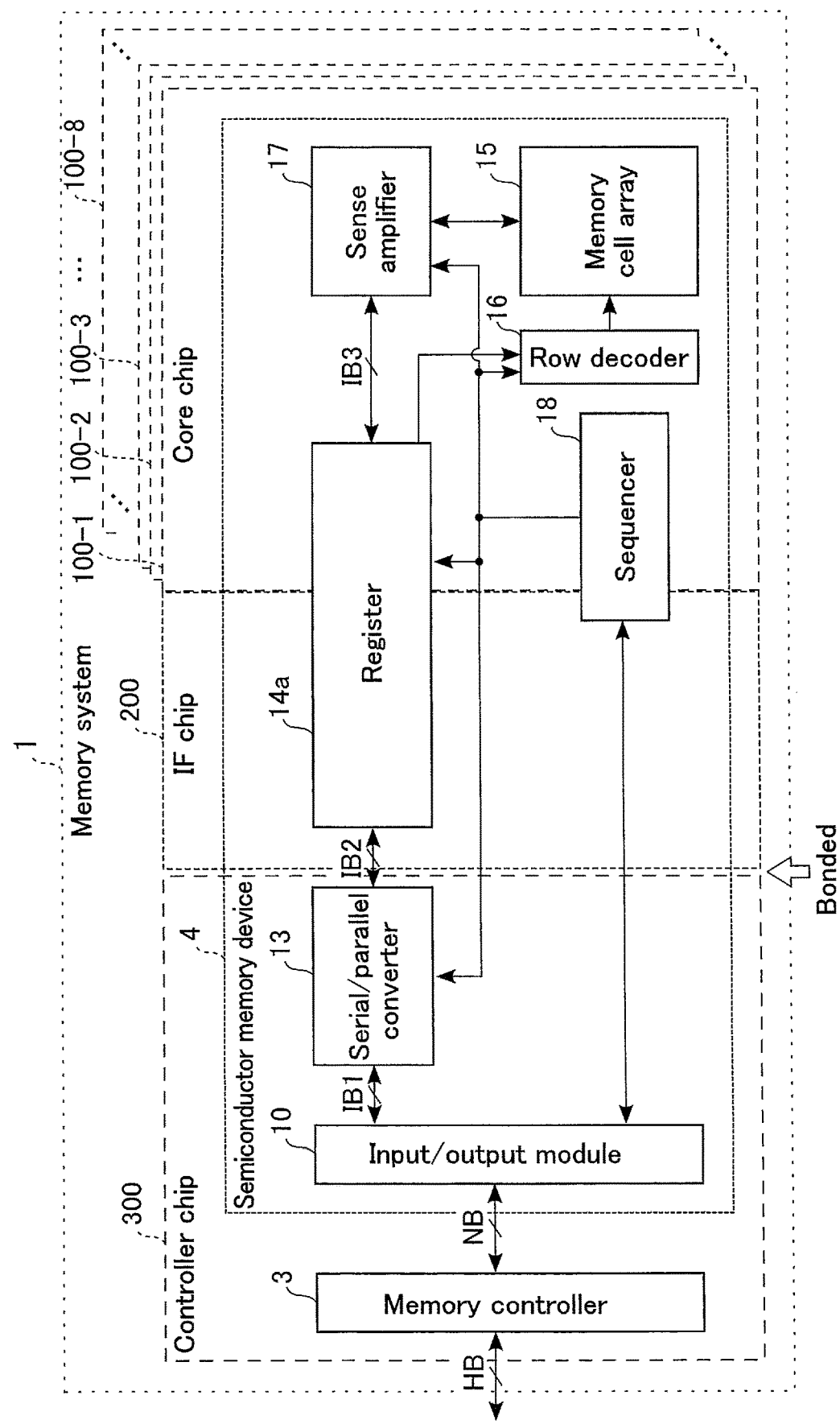
F I G. 18

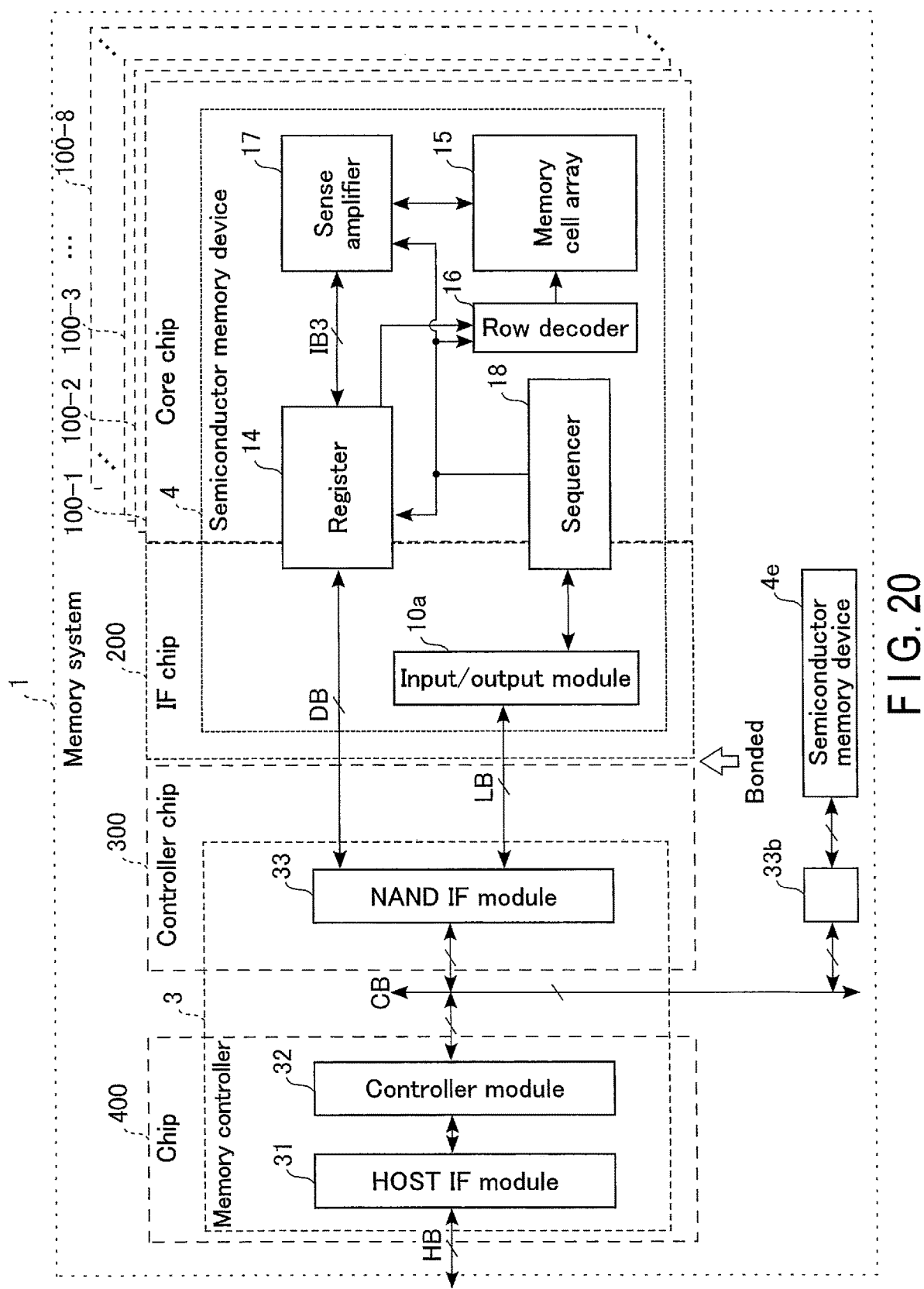
F I G. 20

MEMORY SYSTEM

CROSS-REFERENCE TO RELATED APPLICATIONS

This application is based upon and claims the benefit of priority from Japanese Patent Application No. 2020-111105, filed Jun. 29, 2020, the entire contents of which are incorporated herein by reference.

FIELD

Embodiments described herein relate generally to a memory system.

BACKGROUND

A NAND-type flash memory capable of storing data in a non-volatile manner is known.

BRIEF DESCRIPTION OF THE DRAWINGS

FIG. 9 is a block diagram showing an example of an arrangement of components of a memory system according to a fifth modification of the first embodiment.

FIG. 11 is a block diagram showing an example of an arrangement of components of a memory system according to a seventh modification of the first embodiment.

FIG. 14 is a block diagram showing an example of an arrangement of components of the memory system according to the second embodiment.

FIG. 16 is a block diagram showing an example of an arrangement of components of a memory system according to a second modification of the second embodiment.

FIG. 18 is a block diagram showing an example of an arrangement of components of a memory system according to a fourth modification of the second embodiment.

FIG. 20 is a block diagram showing an example of an arrangement of components of a memory system according to a sixth modification of the second embodiment.

DETAILED DESCRIPTION

In general, according to one embodiment, a memory system includes a first chip and a second chip. The second chip is bonded with the first chip. The memory system includes a semiconductor memory device and a memory controller. The semiconductor memory device includes a memory cell array, a peripheral circuit, and an input/output module. The peripheral circuit is configured to control the memory cell array. The input/output module is coupled to the peripheral circuit. The memory controller is configured to receive an instruction from an external host device and control the semiconductor memory device via the input/output module. The first chip includes the memory cell array. The second chip includes the peripheral circuit, the input/output module, and the memory controller.

Now, the embodiments will be described with reference to the drawings. Each embodiment will exemplify devices and methods for embodying the technical idea of the invention. The drawings are schematic or conceptual, and it is not a requisite that the dimensions, scales, etc., read from each drawing conform to actual products. The technical idea of the invention is not bound by particular component shapes, structures, arrangements, etc.

The description will use the same reference symbols for the structural features or components having the same or substantially the same functions and configurations. Numerals may be added after reference symbol-constituting characters in order to differentiate between elements that are denoted by reference symbols of the same characters and that have substantially the same configurations. If components represented by reference symbols including the same letters need not be distinguished, such components are assigned reference symbols including only the same letters.

[1] First Embodiment

A memory system 1 according to the first embodiment will be described.

[1-1] Configuration

Figure 1:
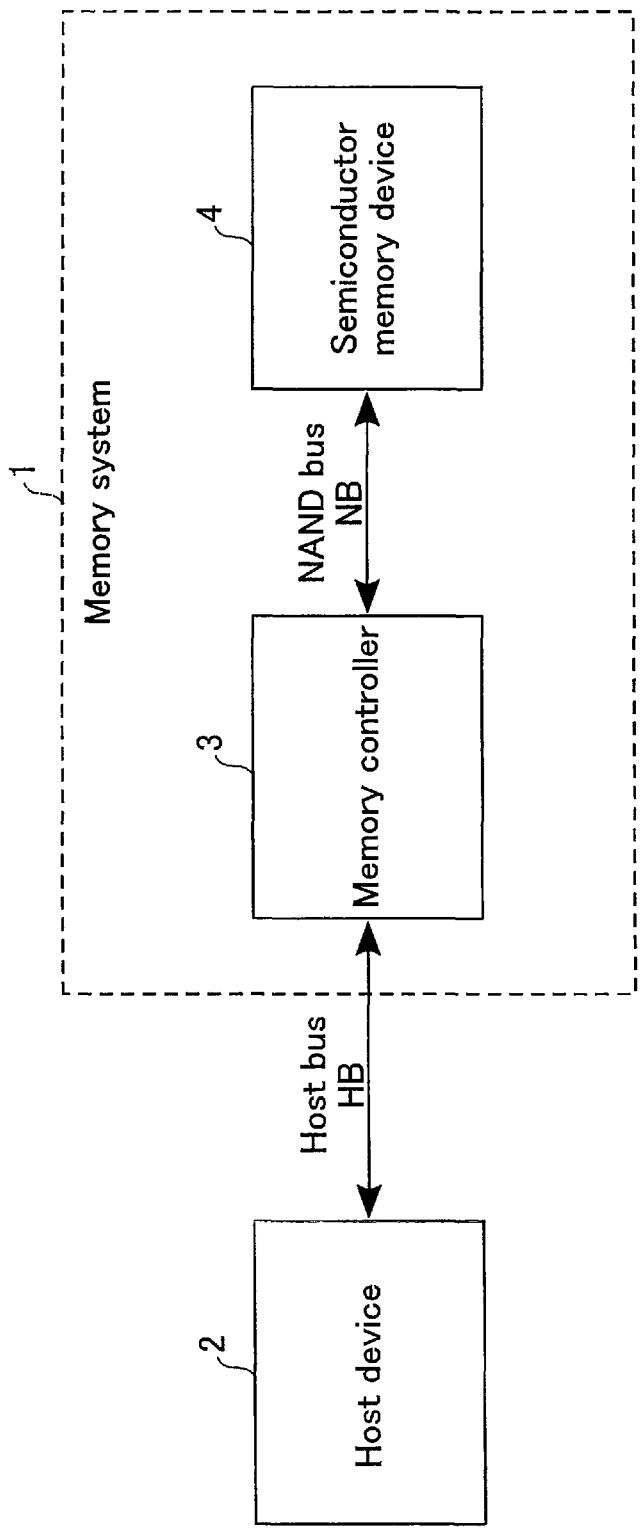
FIG. 1 is a block diagram showing a configuration example of a memory system according to a first embodiment.

FIG. 1 shows a configuration example of the memory system according to the first embodiment. As shown in FIG. 1, the memory system 1 includes a memory controller 3 and a semiconductor memory device 4. The memory controller 3 is coupled to a host bus HB. The memory controller 3 is coupled to the semiconductor memory device 4 through a NAND bus NB. The memory system 1 is a storage device that meets, for example, Universal Flash Storage (UFS) standards.

A host device 2 is, for example, a personal computer or a smart phone. The host bus HB couples the memory system 1 and the host device 2. Communications performed between the memory system 1 and the host device 2 through the host bus HB meets the UFS standards.

The memory controller 3 receives instructions from the host device 2 through the host bus HB. The memory controller 3 transmits a command based on the instructions received from the host device 2 to the semiconductor memory device 4 through the NAND bus NB. The memory controller 3 transmits data received from the semiconductor memory device 4 through the NAND bus NB to the host device 2 through the host bus HB.

The semiconductor memory device 4 is a type of a NAND flash memory, which is capable of storing data in a non-volatile manner. The semiconductor memory device 4 executes operations, such as data writing and reading, based on the command received from the memory controller 3 through the NAND bus NB.

Figure 2:
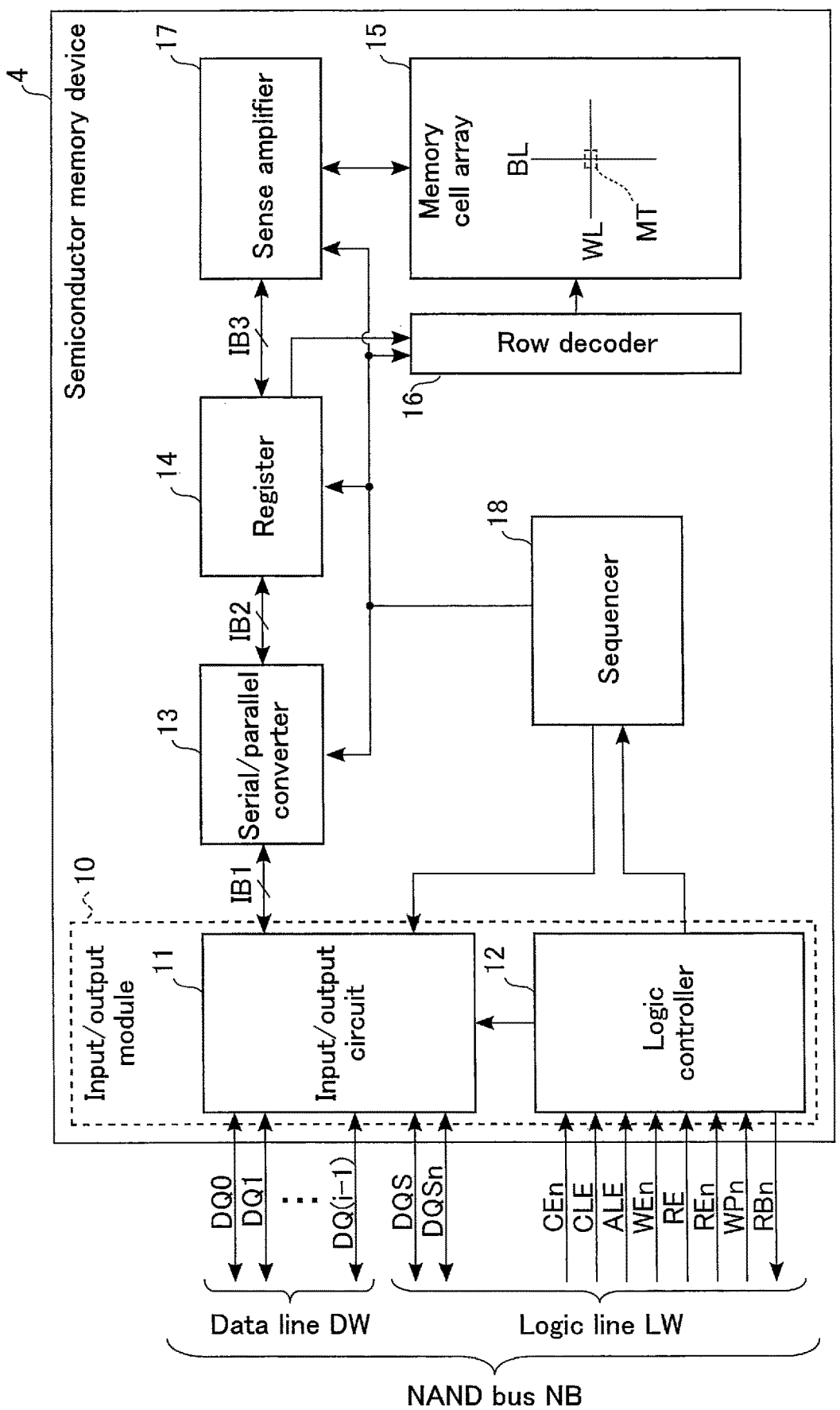
FIG. 2 is a block diagram showing a configuration example of a semiconductor memory device included in the memory system according to the first embodiment.

FIG. 2 shows a configuration example of the semiconductor memory device 4 included in the memory system 1 according to the first embodiment. As shown in FIG. 2, the semiconductor memory device 4 includes an input/output module 10, a serial/parallel converter 13, a register 14, a memory cell array 15, a row decoder 16, a sense amplifier 17, a sequencer 18, a first internal bus IB1, a second internal bus IB2, and a third internal bus IB3.

The input/output module 10 is coupled to the NAND bus NB, and transmits/receives signals to/from the memory controller 3. A plurality of control signals communicated through the NAND bus NB include, for example, signals DQ0 to DQ (i−1), DQS, DQSn, CEn, CLE, ALE, WEn, RE, REn, WPn, and RBn.

The signals DQ0 to DQ (i−1) are transmitted/received between the semiconductor memory device 4 and the memory controller 3, where i is an integer larger than or equal to 2. Each of the signals DQ0 to DQ (i−1) represents either an "H" level or an "L" level. The signals DQ0 to DQ (i−1) represent i bits of information by the combination of the "H" level or the "L" level represented by each of the signals. Signals DQ0 to DQ (i−1) are entities of data transmitted/received between the semiconductor memory device 4 and the memory controller 3, and may include commands, addresses, and data.

Signals DQS and DQSn are transmitted/received between the semiconductor memory device 4 and the memory controller 3. The signals DQS and DQSn are used to control operation timings when the signals DQ0 to DQ (i−1) are received.

The signal CEn is transmitted from the memory controller 3 to the semiconductor memory device 4. The signal CEn is a signal to place the semiconductor memory device 4 in a selected state or a non-selected state. For example, if a plurality of semiconductor memory devices 4 are coupled to the memory controller 3, the memory controller 3 may select a semiconductor memory device 4 to be operated by using the signal CEn. If the signal CEn is of the "H" level, the memory controller 3 places the semiconductor memory device 4 in the non-selected state. If the signal CEn is of the "L" level, the memory controller 3 places the semiconductor memory device 4 in the selected state.

The signals CLE, ALE, WEn, RE, REn, and WPn are each transmitted from the memory controller 3 to the semiconductor memory device 4. The signal CLE is a signal reporting that the signals DQ0 to DQ (i−1) are commands. The signal ALE is a signal reporting that the signals DQ0 to DQ (i−1) are addresses. The signal WEn is a signal instructing the semiconductor memory device 4 to fetch the signals DQ0 to DQ (i−1). The signals RE and REn are signals instructing the semiconductor memory device 4 to output the signals DQ0 to DQ (i−1). Furthermore, the signals RE and REn control an operation timing of the semiconductor memory device 4 when the signals DQ0 to DQ (i−1) are output. The signal WPn is a signal prohibiting the semiconductor memory device 4 from performing write and erase operations.

The signal RBn is transmitted from the semiconductor memory device 4 to the memory controller 3. The signal RBn is a signal indicating that the semiconductor memory device 4 is in a ready state (state of accepting an instruction from outside) or a busy state (state of not accepting an instruction from outside).

The NAND bus NB includes a plurality of wires, for example, corresponding to various signals. Specifically, the NAND bus NB includes i data lines DW respectively corresponding to the signals DQ0 to DQ (i−1) and a plurality of logic lines LW respectively corresponding to the signals DQS, DQSn, CEn, CLE, ALE, WEn, RE, REn, WPn, and RBn.

In the following description of the specification, an amount of information that the bus may transmit at a time is referred to as a bus width. For example, if an internal bus has a 32-bit bus width, the bus includes 32 data lines and is able to transmit 32-bit data at a time. For example, the NAND bus NB including eight lines in common use for commands, addresses, and data has an 8-bit bus width. The bus width of the NAND bus NB is not limited to 8-bit. The NAND bus NB may have a width of any number of bits, for example, bits of a multiple of 4, or bits of a power of two.

The first internal bus IB1, the second internal bus IB2, and the third internal bus IB3 are used as paths to transfer information inside the semiconductor memory device 4. For example, the bus width of the first internal bus IB1 is equal to the bus width of the NAND bus NB. Further, for example, the bus width of the first internal bus IB1 is smaller than the bus width of the second internal bus 1132.

The input/output module 10 includes an input/output circuit 11 and a logic controller 12.

The input/output circuit 11 transmits/receives the signals DQ0 to DQ (i−1), the signal DQS, and the signal DQSn to/from the memory controller 3. The input/output circuit 11 is coupled to the first internal bus IB1. The input/output circuit 11 transmits information based on the received signals DQ0 to DQ (i−1) to the serial/parallel converter 13 through the first internal bus IB1. The input/output circuit 11 outputs the signals DQ0 to DQ (i−1) based on information received from the serial/parallel converter 13 through the first internal bus IB1.

The logic controller 12 receives the signals CEn, CLE, ALE, WEn, RE, REn, and WPn, and transmits the signal RBn. The logic controller 12 transmits a signal based on the received signals to the input/output circuit 11 and the sequencer 18.

The serial/parallel converter 13 performs conversion between a serial signal and a parallel signal. The serial/parallel converter 13 is coupled to the input/output circuit 11 through the first internal bus IB1, and is coupled to the register 14 through the second internal bus IB2. The serial/parallel converter 13 increases the bus width of a signal received through the first internal bus IB1, and transmits the signal to the second internal bus IB2. The serial/parallel converter 13 reduces the bus width of a signal received through the second internal bus IB2, and transmits the signal to the first internal bus IB1.

The register 14 stores the received information, and outputs the stored information outside. The register 14 is coupled to the serial/parallel converter 13 through the second internal bus IB2, and is coupled to the sense amplifier 17 through the third internal bus IB3. For example, the register 14 stores the information received from the serial/parallel converter 13, and outputs the information to the sense amplifier 17. The register 14 stores the information received from the sense amplifier 17, and outputs the information to the serial/parallel converter 13.

The memory cell array 15 stores data in a nonvolatile manner. The memory cell array 15 includes a plurality of bit lines BL, a plurality of word lines WL, and a plurality of memory cells MT. The memory cells MT are arrayed in, for example, a row direction and a column direction. The bit lines BL are arranged in the column direction and coupled to the memory cells MT corresponding to the same column. The word lines WL are arranged in the row direction and are coupled to the memory cells MT corresponding to the same row.

The row decoder 16 receives a row address from the resistor 14 and selects a memory cell MT of a row based on the row address. Thereafter, the row decoder 16 applies a voltage to the memory cell MT of the selected row.

When reading data, the sense amplifier 17 senses the data read from the memory cell MT to a bit line BL, and transfers the sensed read data to the register 14. When writing data, the sense amplifier 17 transfers the write data to be written to the memory cell MT through the bit line BL. Furthermore, the sense amplifier 17 receives a column address from the resistor 14 and outputs data of a column that is based on the column address.

The sequencer 18 controls the entire operation of the semiconductor memory device 4. For example, the sequencer 18 receives a command from the register 14, and executes a read operation or the like based on the received command. The sequencer 18 also controls the input/output circuit 11 under the control of the logic controller 12.

Figure 3:
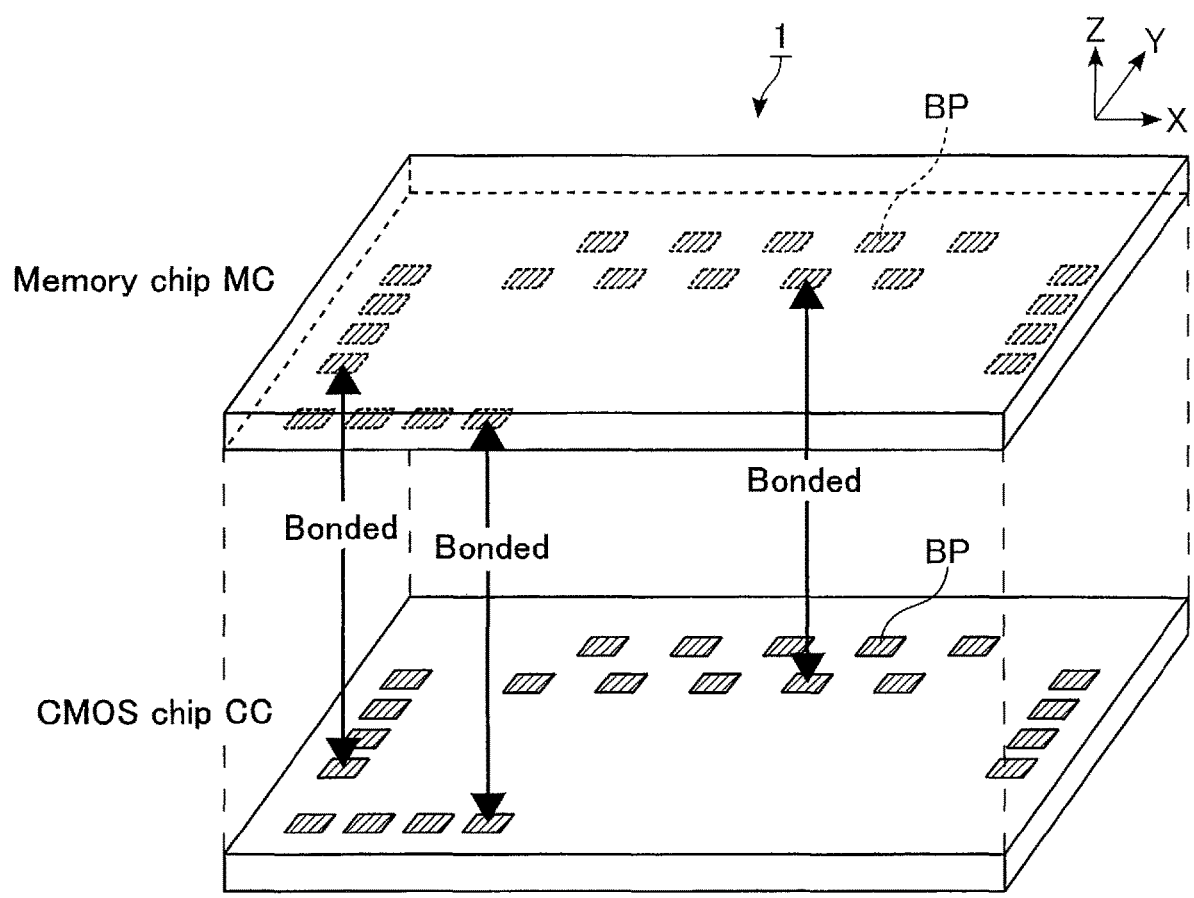
FIG. 3 is a perspective view showing an example of a structure of the memory system according to the first embodiment.

FIG. 3 shows an example of a structure of the memory system 1 according to the first embodiment. As shown in FIG. 3, the memory system 1 includes a memory chip MC and a CMOS chip CC, with the bottom surface of the memory chip MC and the top surface of the CMOS chip CC bonded to each other. The size of the memory chip MC on an XY plane is almost the same as the size of the CMOS chip CC on an XY plane. The memory chip MC includes a structure, for example, corresponding to the memory cell array 15. The memory chip MC is produced by a NAND process. The CMOS chip CC includes a structure, for example, corresponding to the input/output module 10. The CMOS chip CC is produced by a CMOS process. Details of the circuits included respectively in the memory chip MC and the CMOS chip CC will be described later.

The memory chip MC includes a plurality of bonding pads BP in a bottom portion. The bonding pads BP of the memory chip MC are electrically coupled to the circuits in the memory chip MC. The CMOS chip CC includes a plurality of bonding pads BP in a top portion. The bonding pads BP of the CMOS chip CC are electrically coupled to the circuits in the CMOS chip CC. The bonding pads BP of the memory chip MC and the bonding pads BP of the CMOS chip CC are arranged so that the corresponding pads are overlaid with each other when the memory chip MC and the CMOS chip CC are overlaid with each other with their outlines thereof are flush. The bonding pads BP of the memory chip MC and the bonding pads BP of the CMOS chip CC, which face each other, are bonded together and electrically coupled.

Figure 4:
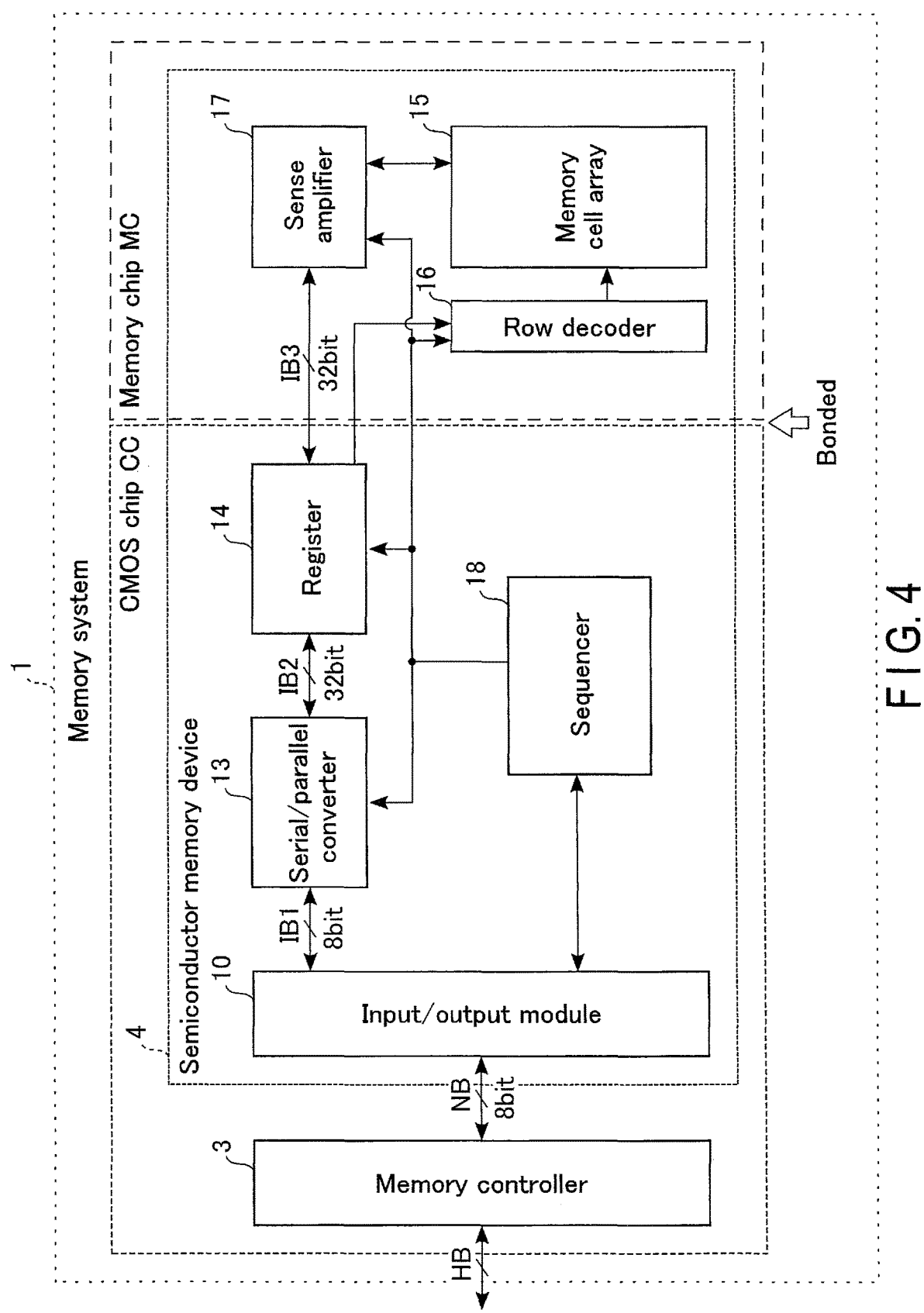
FIG. 4 is a block diagram showing an example of an arrangement of components of the memory system according to the first embodiment.

FIG. 4 shows an example of an arrangement of components of the memory system 1 according to the first embodiment. As shown in FIG. 4, in the memory system 1 of the first embodiment, the CMOS chip CC includes the memory controller 3 and some parts of the semiconductor memory device 4, while the memory chip MC includes the remaining parts of the semiconductor memory device 4 that are not included in the CMOS chip CC. Specifically, the CMOS chip CC includes the memory controller 3, and the input/output module 10, the serial/parallel converter 13, the register 14, and the sequencer 18 of the semiconductor memory device 4. The memory chip MC includes the memory cell array 15, the row decoder 16, and the sense amplifier 17 of the semiconductor memory device 4.

The NAND bus NB has, for example, an 8-bit bus width, and is provided in the CMOS chip CC. The first internal bus IB1 has, for example, an 8-bit bus width, and is provided in the CMOS chip CC. The second internal bus IB2 has, for example, a 32-bit bus width, and is provided in the CMOS chip CC. The third internal bus IB3 has, for example, a 32-bit bus width, and is provided across the CMOS chip CC and the memory chip MC. Specifically, the third internal bus IB3 includes an electrical coupling by the bonding pads BP.

[1-2] Advantages of First Embodiment

The memory system 1 according to the first embodiment described above can increase the communication band of the memory system 1. The advantages of the memory system 1 according to the first embodiment will be detailed below.

To increase the capacity of the semiconductor memory device, it is preferable to increase the area occupied by the memory cell array. In this regard, a semiconductor memory device having a bonded structure is known, in which a NAND chip provided with a memory cell array and a CMOS chip provided with peripheral circuits of the memory cell array are formed of separate wafers bonded together.

The bonded structure can increase the area occupied by the memory cell array and can reduce the chip area. In addition, the bonded structure can suppress deterioration of the CMOS circuit by the NAND process including a high-temperature heat treatment when forming a memory cell array. On the other hand, since the bonded structure is formed by adhering two chips having almost the same size, if it is possible to reduce the area of the peripheral circuits relative to the area of the memory cell array, a free space may occur in the CMOS chip CC.

As the volume of data handled by a host device increases, the communication speed in the memory system needs to be increased. To increase the communication speed, it is preferable to take into consideration the losses due to bonding wires between the semiconductor memory device and the memory controller or wires in a printed circuit board or the like. Thus, it is preferable to suppress the parasitic components, such as the parasitic resistance, the parasitic capacitance, and the parasitic inductance, to be as small as possible.

Therefore, in the memory system 1 according to the first embodiment, the memory controller 3 is arranged in the CMOS chip CC. Specifically, the memory controller 3 and the input/output module 10 of the semiconductor memory device 4 are arranged in the CMOS chip CC. With this arrangement, the memory controller 3 and the semiconductor memory device 4 are wired in a very short distance in the CMOS chip CC, so that the parasitic components can be suppressed. As a result, the memory system 1 according to the first embodiment can increase the operation frequency, and increase the communication band.

Furthermore, in the memory system 1 according to the first embodiment, the memory controller 3 is arranged in a free space of the CMOS chip CC; therefore, a separate chip on which the memory controller 3 is arranged may be omitted. Moreover, in the memory system 1 according to the first embodiment, a step of coupling the memory controller 3 to the semiconductor memory device 4 is integrated with a step of forming the CMOS chip CC, and a process of manufacturing the memory controller 3 is integrated with a process of manufacturing the peripheral circuits of the semiconductor memory device 4, if applicable. As a result, the memory system 1 according to the first embodiment can reduce the cost involved in the formation or coupling of the memory controller 3.

[1-3] Modifications of First Embodiment

The memory system 1 according to the first embodiment may be modified variously. Various modifications will be described below.

First Modification of First Embodiment

Figure 5:
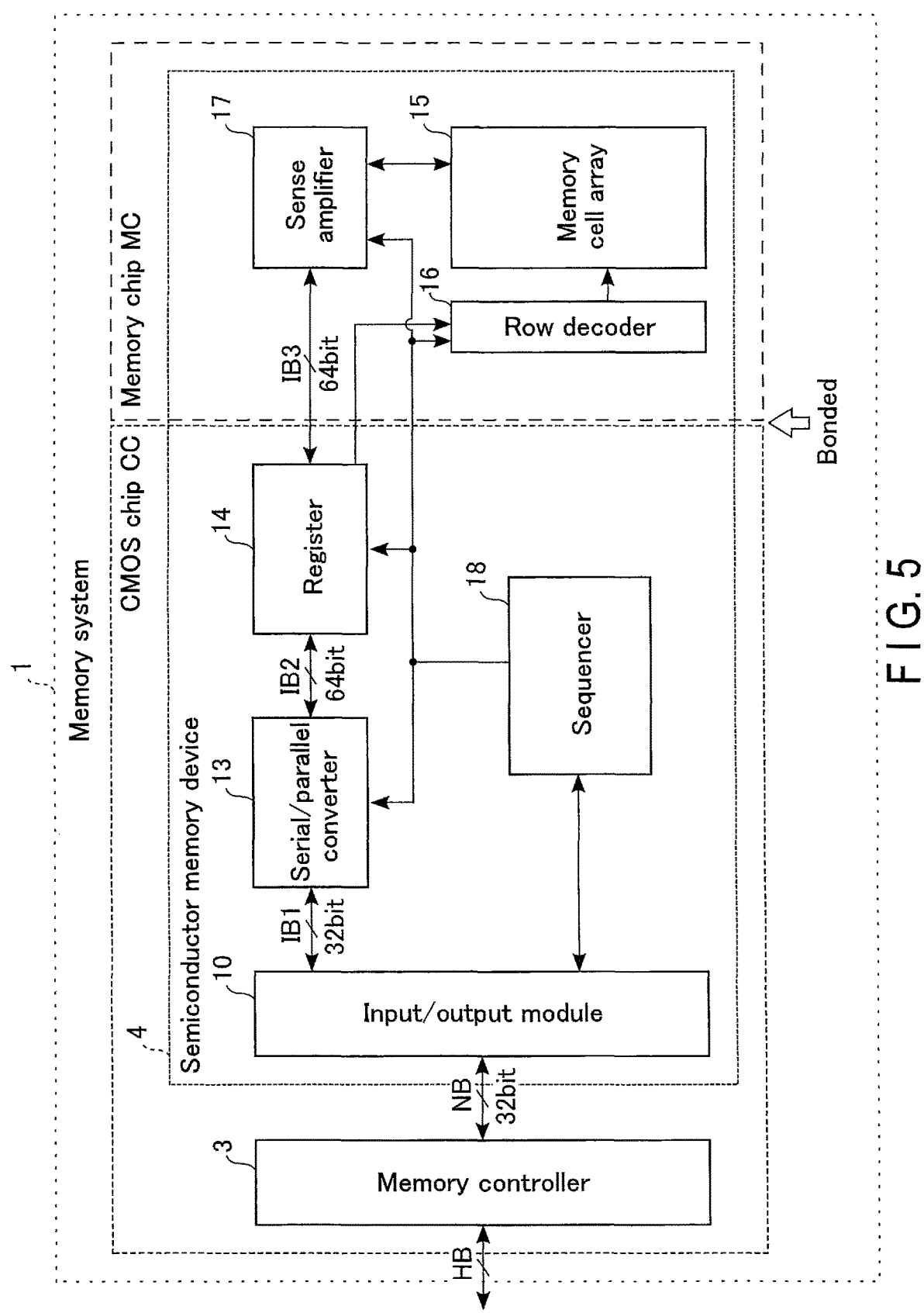
FIG. 5 is a block diagram showing an example of an arrangement of components of a memory system according to a first modification of the first embodiment.

FIG. 5 shows an example of an arrangement of components of a memory system 1 according to the first modification of the first embodiment. As shown in FIG. 5, the memory system 1 according to the first modification of the first embodiment differs from the memory system 1 of the first embodiment in bus width of each of the NAND bus NB, the first internal bus IB1, the second internal bus IB2, and the third internal bus IB3. Specifically, in the memory system 1 according to the first modification of the first embodiment, the NAND bus NB has a 32-bit bus width, the first internal bus IB1 has a 32-bit bus width, the second internal bus IB2 has a 64-bit bus width, and the third internal bus IB3 has a 64-bit bus width. The other configurations in the memory system 1 according to the first modification of the first embodiment are the same as those of the first embodiment.

The amount of information that a bus can transmit at a time depends on the bus width. An increase of the bus width may be considered as a method for increasing the communication speed. However, if the bus width is increased, the number of signal lines included in the bus increases, which may increase the area and volume required to mount the bus. For example, assuming that the controller and the semiconductor memory device are provided on separate chips and the chips are separately mounted on a printed circuit board, if the bus width of the NAND bus NB is increased, additional pins for each chip and additional wires on the printed circuit board that correspond to the increased number of signal lines are required.

In the memory system 1 according to the first embodiment, the NAND bus NB is provided in the CMOS chip CC. Therefore, if the bus width of the NAND bus NB is increased as in the case of the memory system 1 according to the first modification of the first embodiment, the design change in accordance with the increase of the bus width is completed in the CMOS chip CC. Thus, the memory system 1 according to the first modification of the first embodiment can increase the bus width of the NAND bus NB without increasing the pins on the chips and the wires on the printed circuit board.

In the memory system 1 according to the first modification of the first embodiment, the bus width of the first internal bus IB1 is increased to 32 bits in accordance with the increase of the bus width of the NAND bus NB to 32 bits. Furthermore, the bus widths of the second internal bus IB2 and the third internal bus IB3 are increased to 64 bits. Since the first internal bus IB1 and the second internal bus IB2, not only the NAND bus NB, are provided in the CMOS chip CC, the bus widths can be increased without increasing the pins on the chips and the wires on the printed circuit board.

The third internal bus IB3 is provided across the CMOS chip CC and the memory chip MC, and includes the electrical coupling by the bonding pads BP. Therefore, when the bus width of the third internal bus IB3 is increased, the signal lines included in the third internal bus IB3 may increase and the number of bonding pads BP may also increase. However, in the bonded structure, since the bonding pads BP are collectively coupled in one step, the increase in cost can be suppressed even if the number of bonding pads BP is increased. Therefore, in the memory system 1 according to the first modification of the first embodiment, the bus width of the third internal bus IB3 can be increased, while the increase in the cost is suppressed.

Thus, in the memory system 1 according to the first modification of the first embodiment, the bus width of each bus can be increased and the communication band can be increased as compared to the memory system according to the first embodiment, while the increase in the cost is suppressed.

In addition, when the bus width is increased, the communication band can be increased, while, for example, the increase in the operation frequency is suppressed. In the memory system 1 according to the first modification of the first embodiment, the bus width of the NAND bus NB is four times that of the NAND bus NB in the memory system 1 according to the first embodiment. If the operation frequency of the NAND bus NB of the memory system 1 according to the first modification of the first embodiment is, for example, one third of the operation frequency of the NAND bus NB of the memory system 1 according to the first embodiment, the communication band of the memory system 1 according to the first modification of the first embodiment can realize four thirds of the communication speed of the memory system 1 according to the first embodiment. Thus, by increasing the bus width, the communication band of the bus can be increased as compared to the case in which the bus width is not increased, while the operation frequency is suppressed. Furthermore, the circuit implementation can be made easier by reducing the operation frequency of the bus. As a result, the cost of development and the cost of implementation of the memory system 1 can be reduced.

Second Modification of First Embodiment

Figure 6:
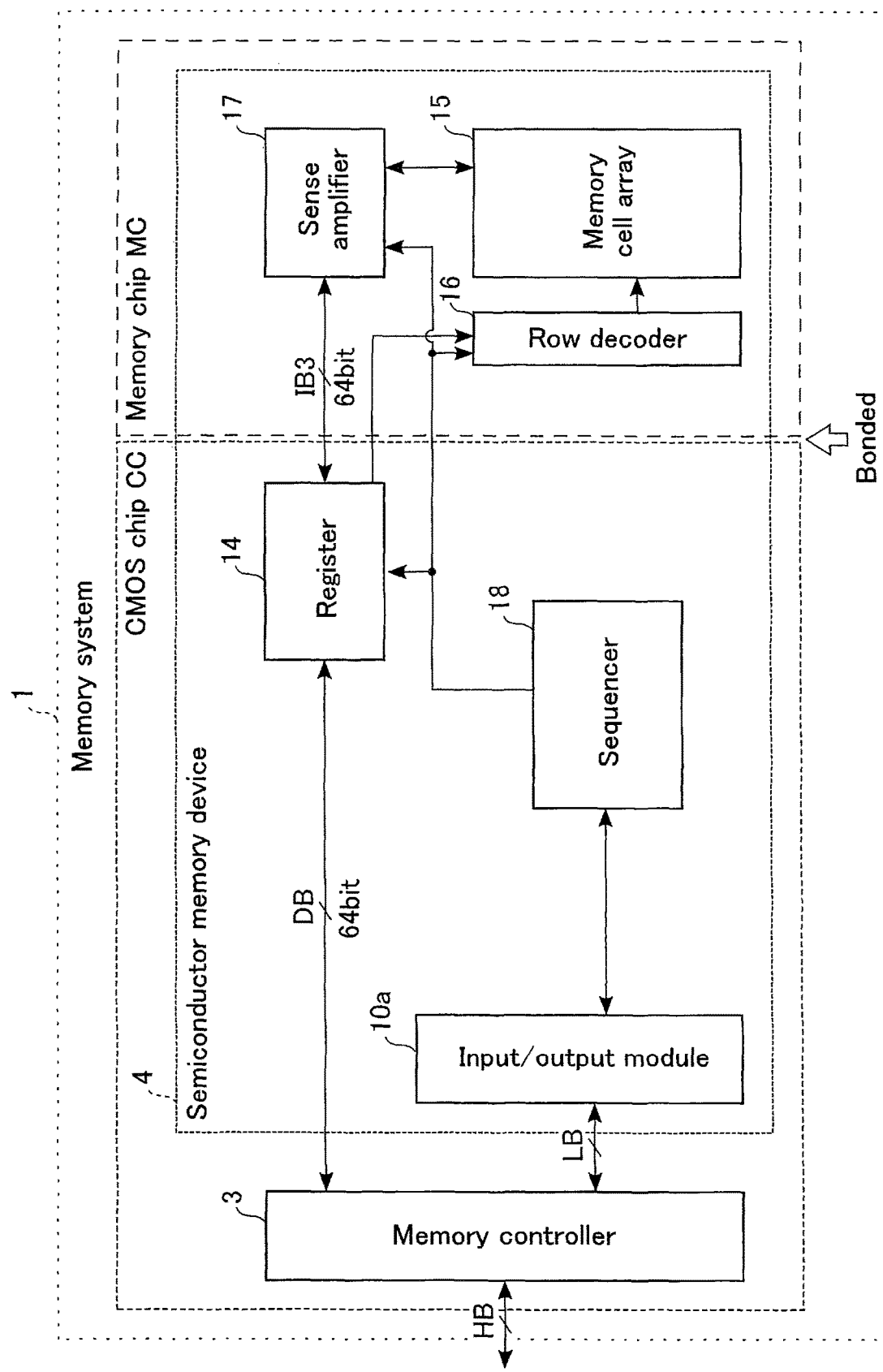
FIG. 6 is a block diagram showing an example of an arrangement of components of a memory system according to a second modification of the first embodiment.

FIG. 6 shows an example of an arrangement of components of a memory system 1 according to the second modification of the first embodiment. As shown in FIG. 6, the memory system 1 according to the second modification of the first embodiment differs from the memory system 1 according to the first modification of the first embodiment in that the NAND bus NB is omitted and that a data bus DB and a logic bus LB are additionally included. The semiconductor memory device 4 included in the memory system 1 according to the second modification of the first embodiment differs from the semiconductor memory device 4 included in the memory system 1 according to the first modification of the first embodiment in that the input/output module 10 has been replaced with an input/output module 10a, and that the serial/parallel converter 13, the first internal bus IB1, and the second internal bus IB2 are omitted.

In the memory system 1 according to the second modification of the first embodiment, the memory controller 3 and the semiconductor memory device 4 are coupled through the data bus DB and the logic bus LB. The data bus DB is a bus that transmits signals corresponding to the signals DQ0 to DQ (i−1) in the first embodiment. The logic bus LB is a bus that transmits signals corresponding to the signals DQS, DQSn, CEn, CLE, ALE, WEn, RE, REn, WPn, and RBn in the first embodiment. The other configurations are similar to those of the first modification of the first embodiment.

In the semiconductor memory device 4 according to the second modification of the first embodiment, the memory controller 3 and the register 14 are directly coupled through the data bus DB having the 64-bit bus width. In other words, neither a serial/parallel converter nor an input/output module is included in the signal path between the memory controller 3 and the register 14. Therefore, in the memory system 1 according to the second modification of the first embodiment, the circuit size can be reduced and the bus width of the bus coupling the memory controller 3 and the semiconductor memory device 4 can be increased. As a result, the memory system 1 according to the second modification of the first embodiment can increase the communication band.

Third Modification of First Embodiment

Figure 7:
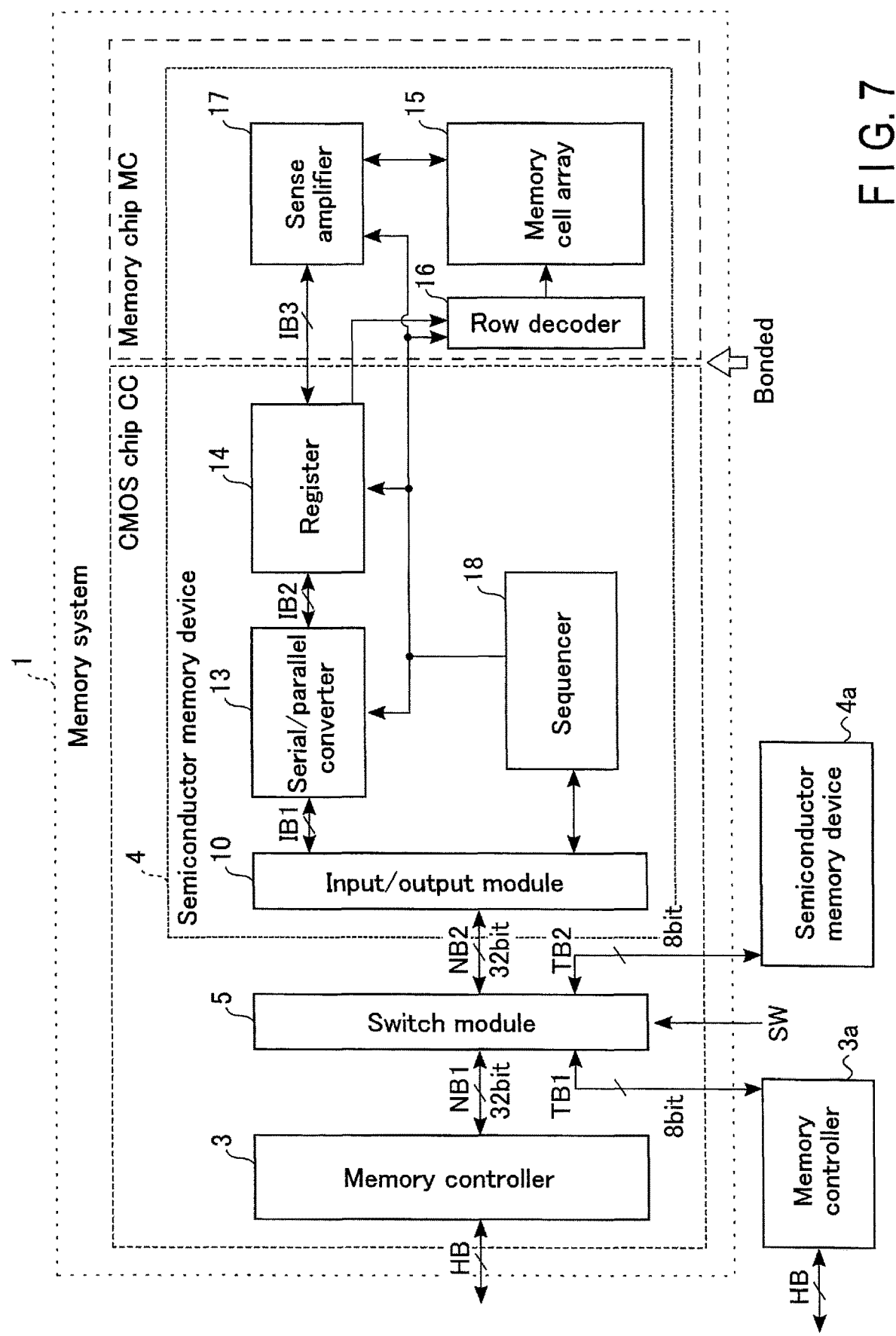
FIG. 7 is a block diagram showing an example of an arrangement of components of a memory system according to a third modification of the first embodiment.

FIG. 7 shows an example of an arrangement of components of a memory system 1 according to the third modification of the first embodiment. As shown in FIG. 7, the memory system 1 according to the third modification of the first embodiment differs from the memory system 1 of the first modification of the first embodiment in that the NAND bus NB has been replaced with a first NAND bus NB1 and a second NAND bus NB2, and that a switch module 5, a first test bus TB1, and a second test bus TB2 are additionally included.

The memory controller 3 and the switch module 5 are coupled through the first NAND bus NB1. The first NAND bus NB1 has, for example, a 32-bit bus width. The switch module 5 and the input/output module 10 included in the semiconductor memory device 4 are coupled through the second NAND bus NB2. The second NAND bus NB2 has, for example, a 32-bit bus width. The switch module 5 is coupled to the first test bus TB1 and the second test bus TB2. The first test bus TB1 and the second test bus TB2 are configured to be coupled to an external device outside the memory system 1. The first test bus TB1 has, for example, an 8-bit bus width. The second test bus TB2 has, for example, an 8-bit bus width.

The first test bus TE1 is coupled to, for example, a memory controller 3a provided outside the memory system 1. The memory controller 3a is coupled to a host device (not shown) through the host bus HB. The second test bus TB2 is coupled to, for example, a semiconductor memory device 4a provided outside the memory system 1.

The switch module 5 receives a signal SW and switches between signals based on the signal SW. If the switch module 5 is coupled to two buses having different bus widths, it has a function of performing serial/parallel conversion. For example, if the switch module 5 couples the first NAND bus NB1 and the second NAND bus NB2, the memory controller 3 and the semiconductor memory device 4 perform communications, so that the memory system 1 functions. For example, if the switch module 5 couples the first test bus TB1 and the second NAND bus NB2, the memory controller 3a and the semiconductor memory device 4 perform communications, so that the operation of the semiconductor memory device 4 may be controlled by the memory controller 3a. For example, if the switch module 5 couples the first NAND bus NB1 and the second test bus TB2, the memory controller 3 and the semiconductor memory device 4a perform communications, so that the operation of the semiconductor memory device 4a may be controlled by the memory controller 3. The other configurations are similar to those of the first modification of the first embodiment.

It is considered that operation tests may be separately performed for the memory controller 3 and the semiconductor memory device 4, which constitute the memory system 1. In the memory system 1 according to the third modification of the first embodiment, by means of the switch module 5, the first test bus TB1, and the second test bus TB2, the extremal memory controller 3a and the semiconductor memory device 4 can be coupled, or the memory controller 3 and the external semiconductor memory device 4a can be coupled. Accordingly, the operations of the semiconductor memory device 4 in the memory system 1 can be checked by the external memory controller 3a. In addition, the operations of the memory controller 3 in the memory system 1 can be checked by the external semiconductor memory device 4a.

Furthermore, in the memory system 1 according to the third modification of the first embodiment, the switch module 5 performs a function of serial/parallel conversion. As a result, the memory system 1 according to the third modification of the first embodiment can be coupled to the external memory controller 3a through the first test bus TB1 having a narrower bus width than the first NAND bus NB1. The memory system 1 according to the third modification of the first embodiment can also be coupled to the external semiconductor memory device 4a through the second test bus TB2 having a narrower bus width than the second NAND bus NB2.

To couple the memory system 1 to an external circuit, it is considered that pads for coupling may be provided on chips, or pins that can be coupled to the external device from the package including the memory system 1 may be provided. In the memory system 1 according to the third modification of the first embodiment, the bus widths of the first test bus TB1 and the second test bus TB2 are smaller than those of the first NAND bus NB1 and the second NAND bus NB2. Therefore, the number of pads or pins for use in coupling between the memory system 1 and an external circuit may be suppressed.

Furthermore, the operation frequency of each of the first NAND bus NB1, the second NAND bus NB2, the first test bus TB1, and the second test bus TB2 may be set to any selected values. For example, when the first NAND bus has a 32-bit bus width and the first test bus TB1 has an 8-bit bus width, the operation frequency of the first test bus TB1 may be set to four times that of the first NAND bus. As the operation frequency is set in this manner, even if the bus width of the first test bus TB1 is smaller than that of the first NAND bus NB1, an equivalent amount of information can be transmitted through those buses.

Alternatively, the operation frequency of the first test bus TB1 may be set lower than that of the first NAND bus NB1. As the operation frequency is set in this manner, although the communication through the first test bus TB1 may be at a lower speed than the communication through the first NAND bus NB1, the operation test can be performed.

In the third modification of the first embodiment described above, for example, the bus widths of the first test bus TB1 and the second test bus TB2 are respectively smaller than those of the first NAND bus NB1 and the second NAND bus NB2. However, the relationship between the bus widths is not limited to this example. For example, the bus width of the first NAND bus NB1 may be equal to the bus width of the first test bus TB1.

Furthermore, the external memory controller 3a may be configured to be coupled to a host device different from the host device to which the memory controller 3 included in the memory system 1 is coupled. For example, when the memory controller 3 included in the memory system 1 meets the UFS standards, the external memory controller 3a may meet embedded MMC (eMMC) standards. With the configuration described above, by a combination of the memory system 1 and the external memory controller 3a, the memory system 1 can meet, for example, the eMMC standards, which are different from the standards the memory system 1 meets.

Fourth Modification of First Embodiment

Figure 8:
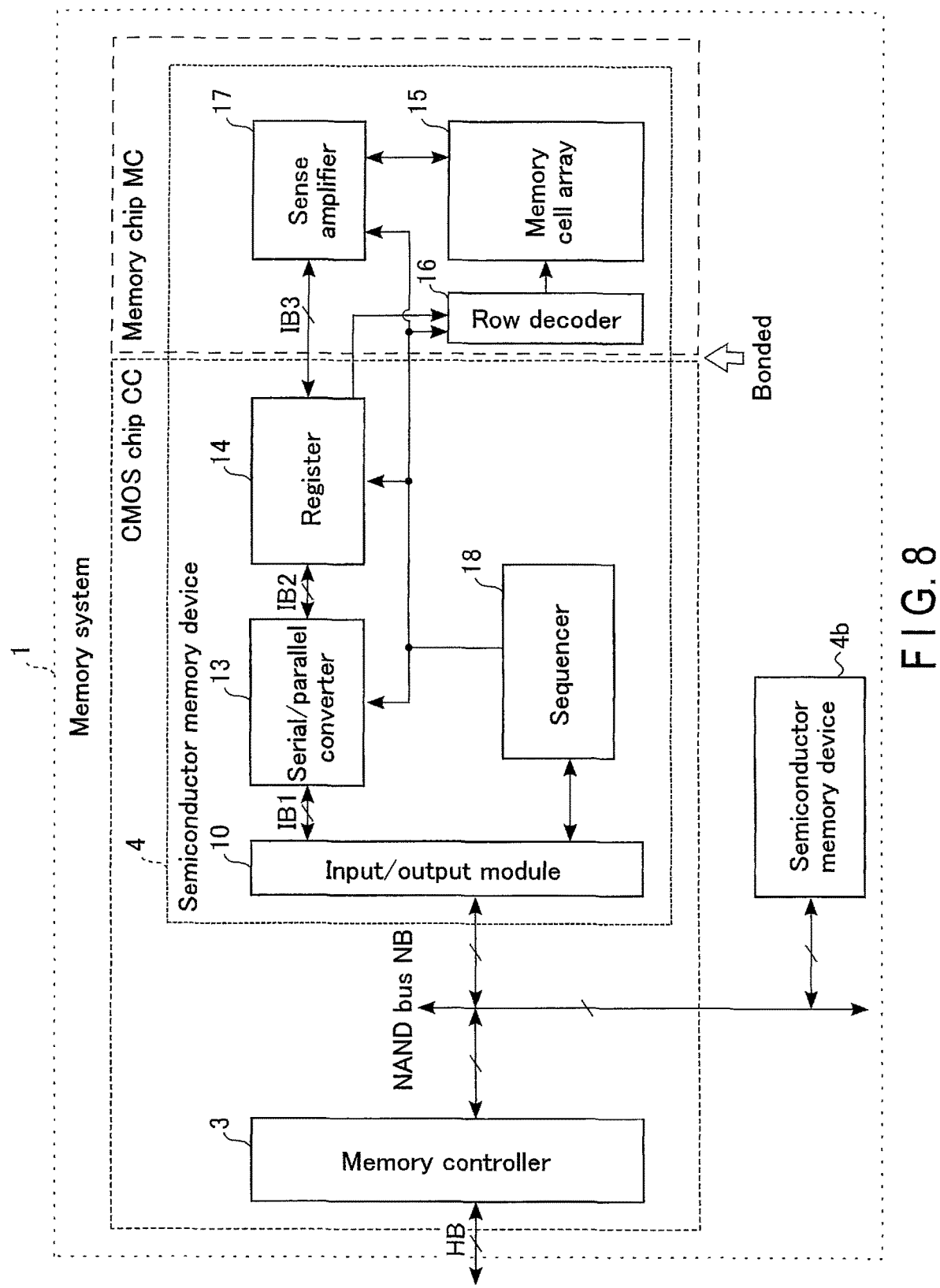
FIG. 8 is a block diagram showing an example of an arrangement of components of a memory system according to a fourth modification of the first embodiment.

FIG. 8 shows an example of an arrangement of components of a memory system 1 according to the fourth modification of the first embodiment. As shown in FIG. 8, the memory system 1 according to the fourth modification of the first embodiment differs from the memory system 1 according to the first embodiment in that the NAND bus NB is provided continuously to the outside of the CMOS chip CC, and that a semiconductor memory device 4b is additionally included.

In the memory system 1 according to the fourth modification of the first embodiment, the NAND bus NB is provided continuously inside and outside the CMOS chip CC. The NAND bus NB couples the memory controller 3, the semiconductor memory device 4, and the semiconductor memory device 4b. The semiconductor memory device 4b may have any configuration as long as operations, such as data storing and data reading, may be executed based on a command received from the memory controller 3 through the NAND bus NB. For example, the semiconductor memory device 4b may have a structure in which a CMOS chip CC and a memory chip MC are overlaid and bonded together, may be formed on a single semiconductor substrate, or may have a structure in which a plurality of semiconductor substrates are stacked. The other configurations are similar to those of the first modification of the first embodiment.

In the memory system 1 according to the fourth modification of the first embodiment, a plurality of semiconductor memory devices are coupled to the NAND bus NB, so that the storage capacity can be increased. In the fourth modification of the first embodiment described above, the semiconductor memory device 4 and the semiconductor memory device 4b are coupled to the NAND bus NB, for example. However, the number of semiconductor memory devices coupled to the NAND bus NB is not limited to two. In the memory system 1 according to the fourth modification of the first embodiment, a greater number of semiconductor memory devices may be coupled to the NAND bus NB, so that the storage capacity can be further increased.

Fifth Modification of First Embodiment

FIG. 9 shows an example of an arrangement of components of a memory system 1 according to the fifth modification of the first embodiment. As shown in FIG. 9, the memory system 1 according to the fifth modification of the first embodiment differs from the memory system 1 according to the first embodiment in that a chip AC is additionally included and that some of the functions of the memory controller 3 are provided in the chip AC.

In the memory system 1 according to the fifth modification of the first embodiment, the memory controller 3 includes a host interface module (HOST IF module) 31, a controller module 32, and a NAND interface module (NAND IF module) 33. The host interface module 31 and the controller module 32 are provided in the chip AC. The NAND interface module 33 is provided in the CMOS chip CC.

The host interface module 31 is coupled to the host bus HB, and communicates with the host device 2 through the host bus HB. The host interface module 31 transmits a signal received from the host device 2 to the controller module 32. The host interface module 31 transmits a signal received from the controller module 32 to the host device 2 through the host bus HB.

The controller module 32 controls the overall operation of the memory controller 3. The controller module 32 is coupled to the NAND interface module 33 through a controller bus CB. The controller module 32 receives a signal from the host interface module 31, and transmits a signal to the NAND interface module 33. The controller module 32 receives a signal from the NAND interface module 33, and transmits a signal to the host interface module 31.

The NAND interface module 33 is coupled to the controller module 32 through the controller bus CB, and is coupled to the input/output module 10 included in the semiconductor memory device 4 through the NAND bus NB. The NAND interface module 33 transmits a signal received from the controller module 32 to the input/output module 10. The NAND interface module 33 transmits a signal received from the input/output module to the controller module 32.

The controller bus CB is, for example, an AHB bus. The bus width of the controller bus CB is, for example, 32 bits.

For example, if the CMOS chip CC and the memory chip MC have a small size or if the memory controller 3 has a large circuit size, it may be difficult to provide all elements of the memory controller 3 in the CMOS chip CC. In the memory system 1 according to the fifth modification of the first embodiment, the NAND interface module 33 of the memory controller 3 is provided in the CMOS chip CC. The circuits other than the NAND interface module 33 of the memory controller 3 are provided in the chip AC, and the chip AC and the CMOS chip CC are coupled through the controller bus CB. The other configurations are similar to those of the first embodiment.

With the configuration described above, in the memory system 1 according to the fifth modification of the first embodiment, although all elements of the memory controller 3 are not provided in the CMOS chip CC, the NAND bus NB can be provided inside the CMOS chip CC in the same manner as in the memory system 1 according to the first embodiment. Moreover, the controller bus CB coupling the chip AC and the CMOS chip CC has a wide bus width, for example, a 32-bit bus width. Therefore, the memory system 1 according to the fifth modification of the first embodiment can speed up the communications between the chip AC and the CMOS chip CC.

Sixth Modification of First Embodiment

Figure 10:
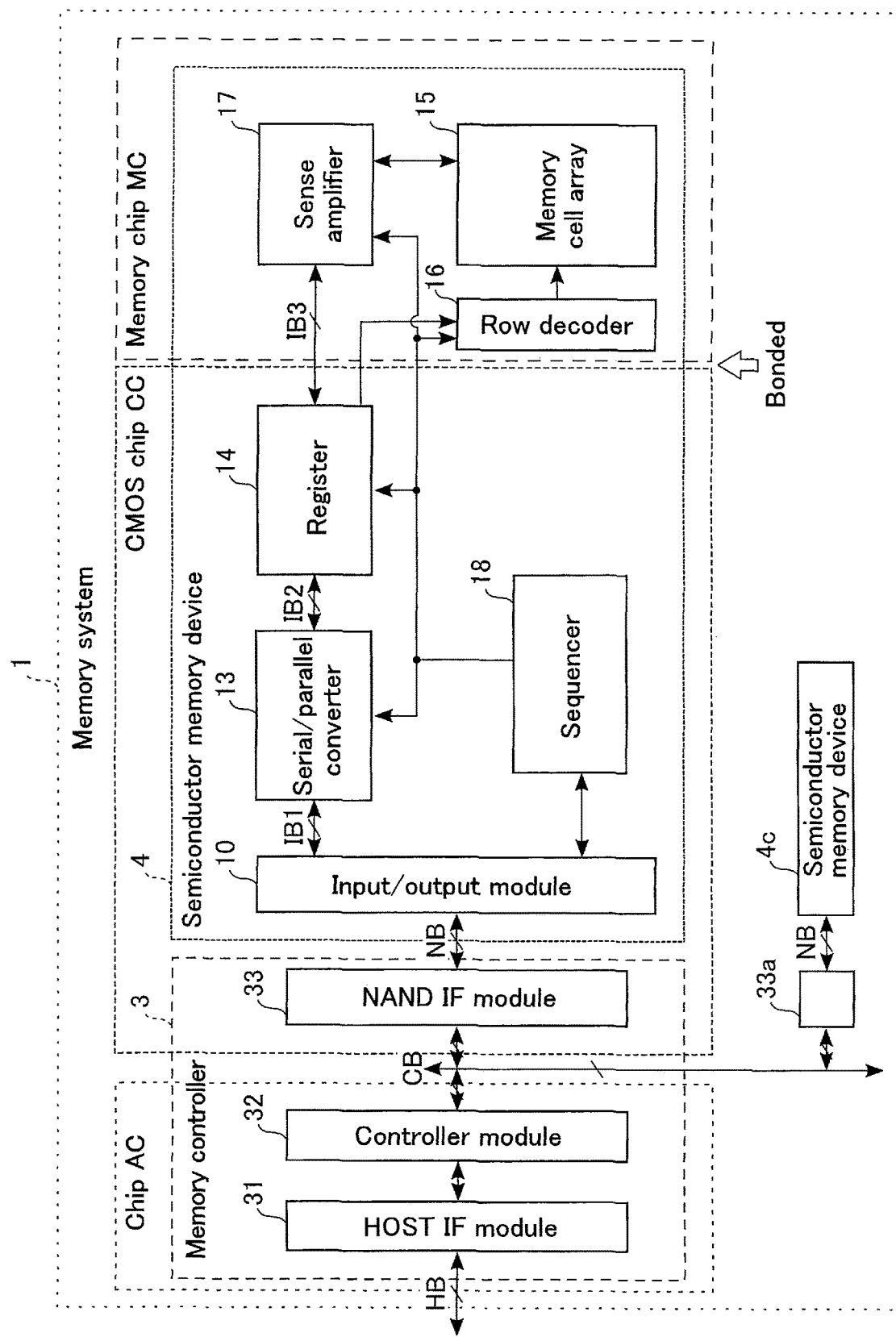
FIG. 10 is a block diagram showing an example of an arrangement of components of a memory system according to a sixth modification of the first embodiment.

FIG. 10 shows an example of an arrangement of components of a memory system 1 according to the sixth modification of the first embodiment. As shown in FIG. 10, the memory system 1 according to the sixth modification of the first embodiment differs from the memory system 1 according to the fifth modification of the first embodiment in that a NAND interface module 33a and a semiconductor memory device 4c are additionally included.

In the memory system 1 according to the sixth modification of the first embodiment, the NAND interface module 33a is coupled to the controller bus CB. The NAND interface module 33a is coupled to the semiconductor memory device 4c through the NAND bus NB. The NAND interface module 33a and the semiconductor memory device 4c may have a structure in which, for example, a CMOS chip CC and a memory chip MC are overlaid and bonded together, may be provided as separate chips, or may be formed on one semiconductor substrate. The other configurations are similar to those of the fifth modification of the first embodiment.

As described above, a plurality of NAND interface modules and semiconductor memory devices are coupled to the controller CB, so that the storage capacity of the memory system 1 can be increased. In the sixth modification of the first embodiment, the NAND interface module 33 and the NAND interface module 33a are coupled to the controller bus CB, for example. However, the number of NAND interface modules to be coupled to the controller bus and the number of semiconductor memory devices included in the memory system 1 are not limited to the example. In the memory system 1 according to the sixth modification of the first embodiment, a greater number of NAND interface modules and semiconductor memory devices may be provided, so that the storage capacity can be further increased.

Seventh and Eighth Modification of First Embodiment

FIG. 11 shows an example of an arrangement of components of a memory system 1 according to the seventh modification of the first embodiment. As shown in FIG. 11, the memory system 1 according to the seventh modification of the first embodiment differs from the memory system 1 according to the first embodiment in that a row decoder 16 is included in the CMOS chip CC. The other configurations are similar to those of the first embodiment.

Figure 12:
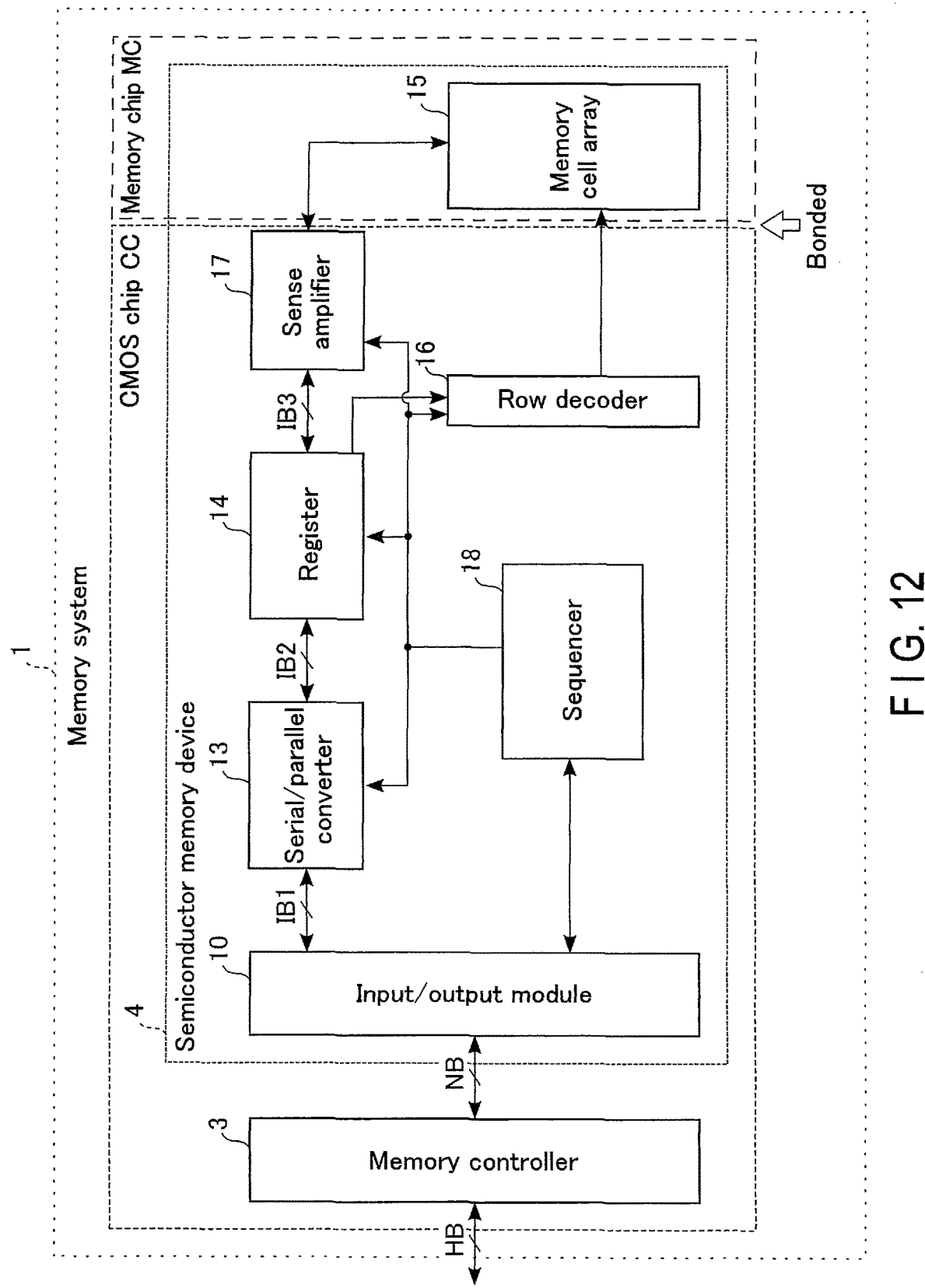
FIG. 12 is a block diagram showing an example of an arrangement of components of a memory system according to an eighth modification of the first embodiment.

FIG. 12 shows an example of an arrangement of components of a memory system 1 according to the eighth modification of the first embodiment. As shown in FIG. 12, the memory system 1 according to the eighth modification of the first embodiment differs from the memory system 1 according to the first embodiment in that a row decoder 16 and a sense amplifier 17 are included in the CMOS chip CC. The other configurations are similar to those of the first embodiment.

The memory chip MC is produced by a NAND process including a step of producing a memory cell array. The memory chip MC may include at least a memory cell array 15. Each of the row decoder 16 and the sense amplifier 17 may be provided in either the memory chip MC or the CMOS chip CC. The first to sixth modifications of the first embodiment may be modified in the same manner as in the seventh and eighth modifications of the first embodiment.

[2] Second Embodiment

The semiconductor memory device according to the second embodiment differs from the semiconductor memory device according to the first embodiment in the configuration of the chips and the coupling method. In the following, a description will be given of differences between the semiconductor memory device according to the second embodiment and that of the first embodiment.

[2-1] Configuration

Figure 13:
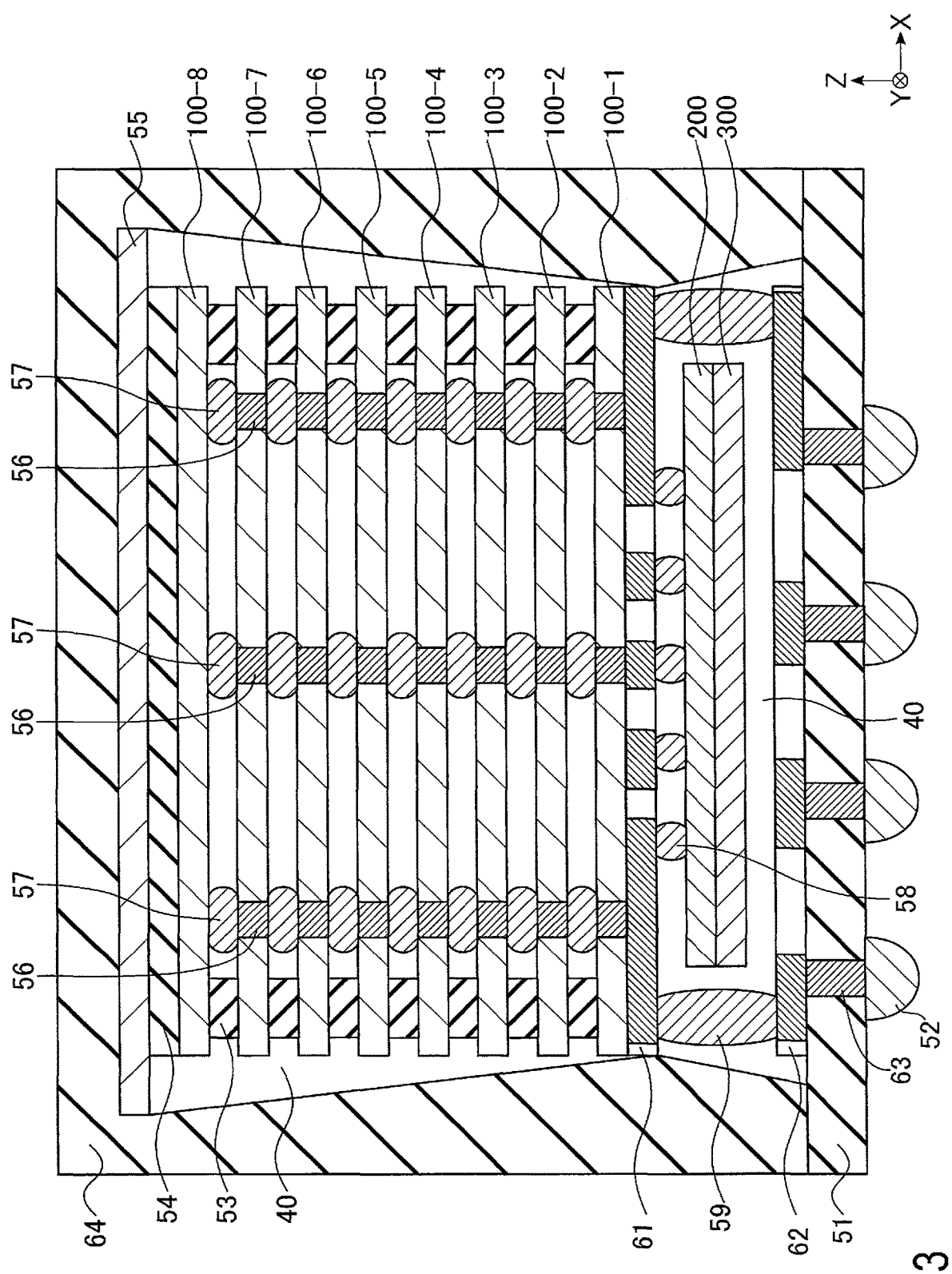
FIG. 13 is a cross-sectional view showing an example of a structure of a memory system according to a second embodiment.

FIG. 13 shows an example of a cross-sectional structure of a memory system 1 according to the second embodiment. As shown in FIG. 13, the memory system 1 according to the second embodiment includes core chips 100-1 to 100-8, an IF chip 200, a controller chip 300, a sealing resin 40, a package board 51, a plurality of solder balls 52, a plurality of spacers 53, an adhesive 54, a support plate 55, a plurality of through silicon vias 56, a plurality of solder balls 57, 58, and 59, rewiring layers 61 and 62, and a package 64.

Each of the core chips 100-1 to 100-8 includes at least a memory cell array. Each of the core chips 100-1 to 100-8 is produced by a NAND process. The IF chip 200 includes at least an input/output module 10. The controller chip 300 includes at least some parts of a memory controller 3. The controller chip 300 is produced by a CMOS process. Details of circuits included in each chip will be described later.

The rewiring layer 62 is arranged on an upper surface of the package board 51. The package board 51 is a ball grid array (BGA) board provided with the solder balls 52 that function as terminals to be coupled to an external device, for example, a host device 2. The package board 51 contains, for example, bismaleimide triazine (BT).

The IF chip 200 and the controller chip 300 overlaid and bonded together are arranged above the package board 51 and the rewiring layer 62. The IF chip 200 and the controller chip 300 have a bonded structure as in the first embodiment described above with reference to FIG. 3. In the example shown in FIG. 13, the IF chip 200 and the controller chip 300 are arranged such that the former is on top of the latter. The sealing resin 40 is sealed between the package board 51 and the controller chip 300, although the hatching is not shown in FIG. 13. The bonded structure formed of the IF chip 200 and the controller chip 300 may be directly arranged on the package board 51 without the sealing resin 40 being sealed therebetween.

The rewiring layer 61 is arranged on top of the bonded structure of the IF chip 200 and the controller chip 300. A layer stack formed of the core chips 100-1 to 100-8 is arranged on top of the rewiring layer 61. The spacers 53 are interposed between the two adjacent core chips 100 to keep the space therebetween. The spacers 53 may be formed of an adhesive insulating resin, for example, epoxy resin, polyimide resin, acrylic resin, phenol resin, or benzocyclobutene resin. Each core chip 100 has a surface wire and a back surface wire, and the core chips 100 are stacked such that in each core chip, the surface on which the surface wire is formed faces downward (face-down).

The upper surface of the uppermost core chip 100-8 of the layer stack adheres to the support plate 55 via the adhesive 54. As the adhesive 54, an insulating resin or a die attach film may be used. The support plate 55 prevents the core chips 100 from being broken due to mechanical stress, when the layer stack of the core chips 100 is handled. As the support plate 55, for example, a metal plate, such as a lead frame, may be used. The material of the support plate 55 may be, for example, Cu or 42 alloy (Fe—Ni based alloy).

The through silicon vias 56 are provided in the core chips 100-1 to 100-7, other than the uppermost core chip 100-8 of the layer stack. Although not shown in the drawings, the through silicon vias 56 are insulated from the core chips 100 by side-wall insulating films. The material of the through silicon vias 56 may be, for example, Cu, Ni, Al, or the like. The through silicon vias 56 of the core chips 100-1 to 100-7 are coupled to the through silicon vias of the core chips 100-2 to 100-7 and the core chip 100-8 on top of the respective core chips via the solder balls 57. As a result, the through silicon vias 56 at the same positions on XY planes of the respective core chips 100-1 to 100-7 are coupled to each other, so that the core chips 100-1 to 100-8 are coupled to one another via the through silicon vias 56 and the solder balls 57.

The through silicon vias of the lowermost core chip 100-1 of the layer stack are electrically coupled to the wire in the rewiring layer 61. The IF chip 200 is electrically coupled to the wire in the rewiring layer 61 via the solder balls 58. The wire in the rewiring layer 61 is electrically coupled to the wire in the rewiring layer 62 via the solder balls 59. The wire in the rewiring layer 62 is electrically coupled to the solder balls 52 via a wire 63. Thus, the layer stack of the core chips 100 is electrically coupled to the bonded structure formed of the IF chip 200 and the controller chip 300. In addition, each of the layer stack of the core chips 100, the IF chip 200, and the controller chip 300 of the bonded structure is electrically coupled to the external host device 2 via the wiring layers and solder balls.

The bonded structure formed of the layer stack of the core chips 100, the IF chip 200, and the controller chip 300 is disposed in the package 64 filled with the sealing resin 40. In other words, the layer stack of the core chips 100, the IF chip 200, and the controller chip 300 are sealed within one package with the sealing resin. The package 64 may be formed of the same material as the sealing resin 40.

The controller chip 300 may be coupled to the host device 2 via the IF chip 200. For example, the IF chip 200 may include through silicon vias penetrating through the IF chip 200 from a bonding surface to a back surface. Then, the controller chip 300 may be coupled to the solder balls 58 via the through silicon vias provided in the IF chip 200.

Alternatively, the controller chip 300 may be coupled to the host device 2 not via the IF chip 200. Specifically, the controller chip 300 may be electrically coupled to the wire in the rewiring layer 61 not via the IF chip 200. The wire in the rewiring layer 61 is electrically coupled to the wire in the rewiring layer 62 via the solder balls 59. The wire in the rewiring layer 62 is coupled to the solder balls 52 via the wire 63. The controller chip 300 may be coupled to the wire in the rewiring layer 62 not via the wire in the rewiring layer 61, and may be coupled to the solder balls 52 via the wire 63. In this case, the controller chip 300 may be coupled to the solder balls 58 via the through silicon vias provided in the controller chip 300.

FIG. 14 shows an example of an arrangement of components of the memory system 1 according to the second embodiment. As shown in FIG. 14, in the memory system 1 according to the second embodiment, each of the core chips 100 includes a memory cell array 15, a row decoder 16, a sense amplifier 17, a part of a register 14, and a part of a sequencer 18. The IF chip 200 includes an input/output module 10, a serial/parallel converter 13, a part of the register 14, and a part of the sequencer 18. The controller chip 300 includes a memory controller 3.

The NAND bus NB has, for example, an 8-bit bus width, and is provided across the controller chip 300 and the IF chip 200. The NAND bus NB includes an electrical coupling by bonding pads. A third internal bus IB3 is provided within the core chip 100. The other configurations are similar to those of the first embodiment.

In the example described with reference to FIG. 14, a part of the register 14 and a part of the sequencer 18 are provided in each of the core chips 100 and the IF chip 200. However, the arrangement of the register 14 and the sequencer 18 is not limited to this example. For example, the register 14 may be provided in only the IF chip 200, or in a plurality of core chips 100. Furthermore, for example, the sequencer 18 may be provided in only the IF chip 200, or in a plurality of core chips 100.

[2-2] Advantages of Second Embodiment

The memory system 1 according to the second embodiment described above can increase the communication band of the memory system 1 in the same manner as in the first embodiment. Hereinafter, details of advantages of the memory system 1 according to the second embodiment will be described regarding the points different from the first embodiment.

In the memory system 1 according to the second embodiment, the semiconductor memory device 4 is formed of the core chips 100 and the IF chip 200. In the semiconductor memory device 4 included in the memory system 1 according to the second embodiment, the core chips 100 each including the memory cell array 15 are stacked, and the IF chip 200 including the input/output module 10 is shared by the core chips 100. With this configuration, the storage capacity can be increased while the cost is suppressed, as compared to the case in which a plurality of semiconductor memory devices are provided.

The memory system 1 according to the second embodiment includes a bonded structure in which the IF chip 200 including the input/output module 10 and the controller chip 300 including the memory controller 3 are overlaid and bonded together. With this configuration, the NAND bus NB included in the memory system 1 according to the second embodiment is provided in a route including the coupling via bonding pads across the IF chip 200 and the controller chip 300.

In the coupling via bonding pads, the parasitic components of signal lines can be suppressed as compared to the case of coupling that uses a wire on a printed circuit board or coupling that uses bonding wires. As a result, in the memory system 1 according to the second embodiment, the speed of communications between the memory controller 3 and the semiconductor memory device 4 can be increased in the same manner as in the memory system 1 according to the first embodiment.

[2-3] Modifications of Second Embodiment

The memory system 1 according to the second embodiment may be modified variously. Various modifications will be described below.

First Modification of Second Embodiment

Figure 15:
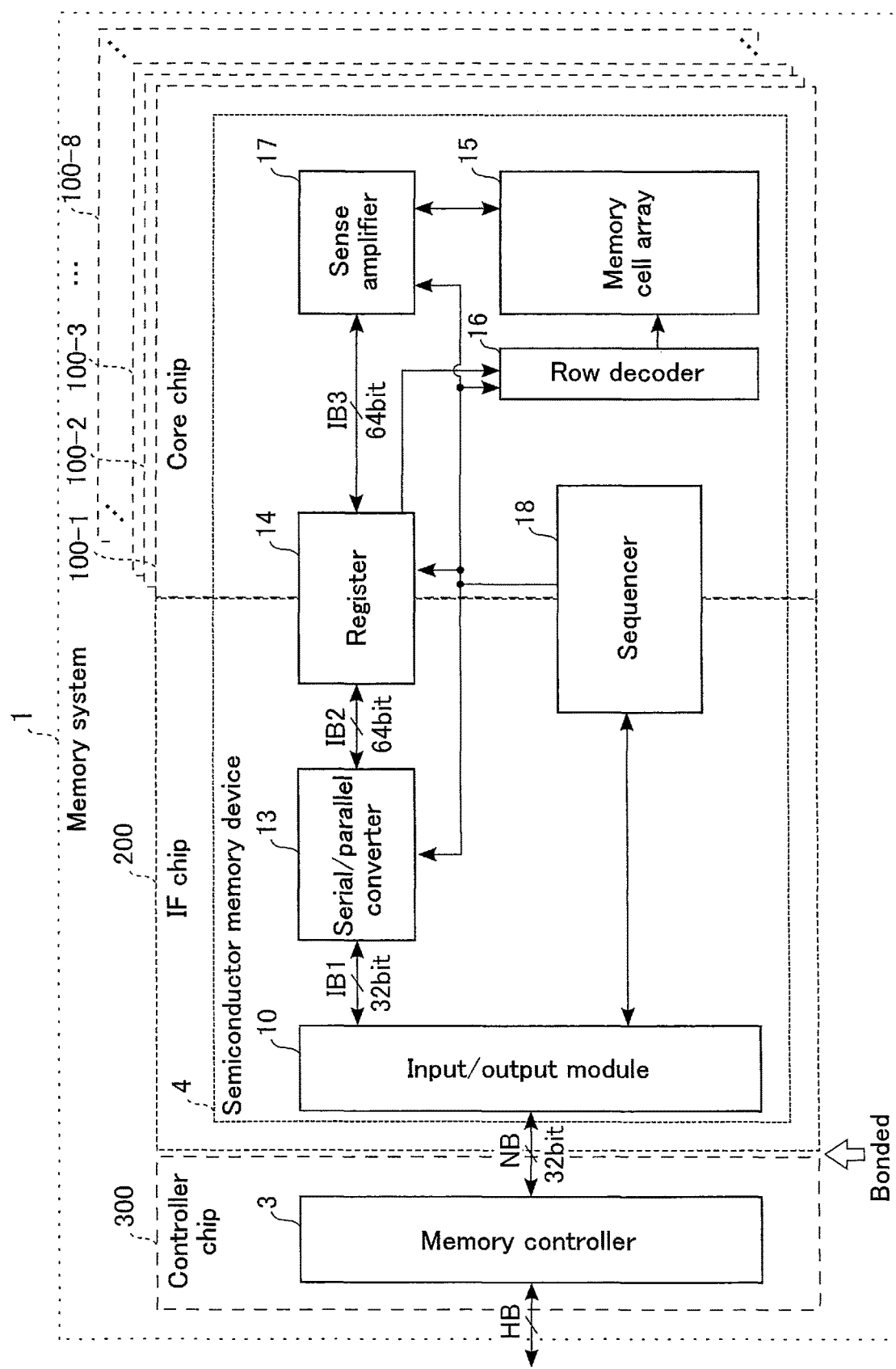
FIG. 15 is a block diagram showing an example of an arrangement of components of a memory system according to a first modification of the second embodiment.

FIG. 15 shows an example of an arrangement of components of a memory system 1 according to the first modification of the second embodiment. As shown in FIG. 15, the first modification of the second embodiment differs from the second embodiment in that the memory system 1 has been modified in the same manner as in the first modification of the first embodiment. Specifically, the memory system 1 according to the first modification of the second embodiment differs from the memory system 1 according to the second embodiment in the bus width of each of the NAND bus NB, the first internal bus IB1, the second internal bus IB2, and the third internal bus IB3. More specifically, in the memory system 1 according to the first modification of the second embodiment, the NAND bus NB has a 32-bit bus width, the first internal bus IB1 has a 32-bit bus width, the second internal bus IB2 has a 64-bit bus width, and the third internal bus IB3 has a 64-bit bus width. The other configurations are the same as those of the memory system 1 of the second embodiment.

The memory system 1 according to the first modification of the second embodiment can increase the bus width of each bus, while suppressing the increase in cost, in the same manner as in the memory system 1 according to the first modification of the first embodiment, so that the communication band can be increased.

Second Modification of Second Embodiment

FIG. 16 shows an example of an arrangement of components of a memory system 1 according to the second modification of the second embodiment. As shown in FIG. 16, the second modification of the second embodiment differs from the first modification of the second embodiment in that the memory system 1 has been modified in the same manner as in the second modification of the first embodiment. Specifically, the memory system 1 according to the second modification of the second embodiment differs from the memory system 1 according to the first modification of the second embodiment in that communications are performed through a data bus DB and a logic bus LB without using a NAND bus NB. The semiconductor memory device 4 included in the memory system 1 according to the second modification of the second embodiment differs from the semiconductor memory device 4 included in the memory system 1 according to the first modification of the second embodiment in that the input/output module 10 has been replaced with an input/output module 10a, and that the serial/parallel converter 13, the first internal bus IB1, and the second internal bus IB2 are omitted.

Therefore, in the memory system 1 according to the second modification of the second embodiment, the circuit size can be reduced and the bus width of the bus coupling the memory controller 3 and the semiconductor memory device 4 can be increased, in the same manner as in the memory system 1 according to the second modification of the first embodiment. As a result, the memory system 1 according to the second modification of the second embodiment can increase the communication band.

Third Modification of Second Embodiment

Figure 17:
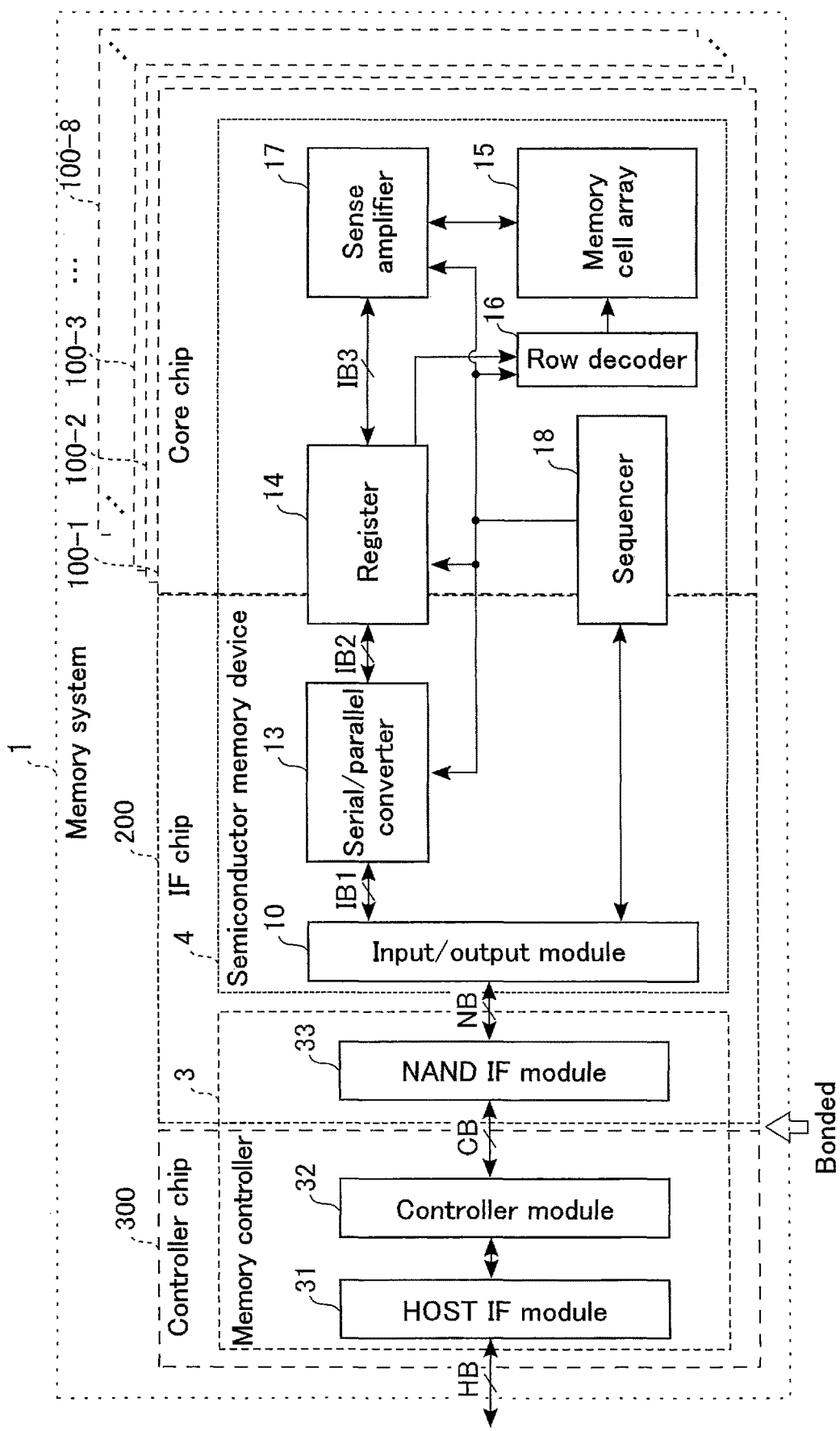
FIG. 17 is a block diagram showing an example of an arrangement of components of a memory system according to a third modification of the second embodiment.

FIG. 17 shows an example of an arrangement of components of a memory system 1 according to the third modification of the second embodiment. As shown in FIG. 17, the memory system 1 according to the third modification of the second embodiment differs from the memory system 1 according to the second embodiment in that a controller is provided across a controller chip 300 and an IF chip 200 and that the controller chip 300 and the IF chip 200 are coupled through a controller bus CB.

In the memory system 1 according to the third modification of the second embodiment, a memory controller 3 includes a host interface module (HOST IF module) 31, a controller module 32, and a NAND interface module (NAND IF module) 33. The host interface module 31 and the controller module 32 are provided in the controller chip 300. The NAND interface module 33 is provided in the IF chip 200.

The host interface module 31 is coupled to the host bus HB, and communicates with the host device 2 through the host bus HB. The host interface module 31 transmits a signal received from the host device 2 to the controller module 32. The host interface module 31 transmits a signal received from the controller module 32 to the host device 2 through the host bus HB.

The controller module 32 controls the overall operation of the memory controller 3. The controller module 32 is coupled to the NAND interface module 33 through the controller bus CB. The controller module 32 receives a signal from the host interface module 31, and transmits a signal to the NAND interface module 33. The controller module 32 receives a signal from the NAND interface module 33, and transmits a signal to the host interface module 31.

The NAND interface module 33 is coupled to the controller module 32 through the controller bus CB, and coupled to the input/output module 10 included in the semiconductor memory device 4 through the NAND bus NB. The NAND interface module 33 transmits a signal received from the controller module 32 to the input/output module 10. The NAND interface module 33 transmits a signal received from the input/output module to the controller module 32.

The controller bus CB is, for example, an ABB bus. The bus width of the controller bus CB is, for example, 32 bits.

For example, if the size of circuits included in the controller chip 300 is large and the size of circuits included in the IF chip 200 is small, since the controller chip 300 and the IF chip 200 are provided to have the same size, the chip of the small circuit size is low in integration density, so that the cost may increase. In the memory system 1 according to the third modification of the second embodiment, the memory controller 3 is provided across the controller chip 300 and the IF chip 200. Specifically, the NAND interface module 33 of the memory controller 3 is provided on the IF chip 200. The circuits other than the NAND interface module 33 of the memory controller 3 are provided in the controller chip 300. The controller chip 300 and the IF chip 200 are coupled through the controller bus CB.

With this configuration, in the memory system 1 according to the third modification of the second embodiment, the size of circuits included in the controller chip 300 can be substantially equal to the size of circuits included in the IF chip 200. As a result, the integration density of each of the controller chip 300 and the IF chip 200 can be increased, so that the cost can be suppressed. Furthermore, since the NAND bus NB can be provided within the IF chip 200, the parasitic components of the signal lines forming the NAND bus NB can be suppressed. Moreover, the controller bus CB coupling the controller chip 300 and the IF chip 200 has a wide bus width, for example, a 32-bit bus width. Therefore, the memory system 1 according to the third modification of the second embodiment can increase the communication band.

Fourth Modification of Second Embodiment

FIG. 18 shows an example of an arrangement of components of a memory system 1 according to the fourth modification of the second embodiment. As shown in FIG. 18, the memory system 1 according to the fourth modification of the second embodiment differs from the memory system 1 according to the second embodiment in that the register 14 has been replaced with a register 14a and in that which chip each circuit component is disposed in has been changed.

Specifically, the register 14a is larger in scale than the register 14 included in the memory system 1 according to the second embodiment. The register 14a is provided across the IF chip 200 and the core chips 100; however, a greater part of the register 14a is provided in the IF chip 200.

The IF chip 200 includes the greater part of the register 14a and a part of the sequencer 18. A greater area of the IF chip 200 is occupied by the register 14a. The controller chip 300 includes the memory controller 3, the input/output module 10, and the serial/parallel converter 13. The NAND bus NB is provided in the controller chip 300. The first internal bus IB1 is provided in the controller chip 300. The second internal bus IB2 is provided across the controller chip 300 and the IF chip 200, and includes coupling via bonding pads.

The register 14a can be used as, for example, a cache memory of the semiconductor memory device 4. In the memory system 1 according to the fourth modification of the second embodiment, a cache memory of a large capacity can be implemented by the register 14a of a large scale.

Fifth Modification of Second Embodiment

Figure 19:
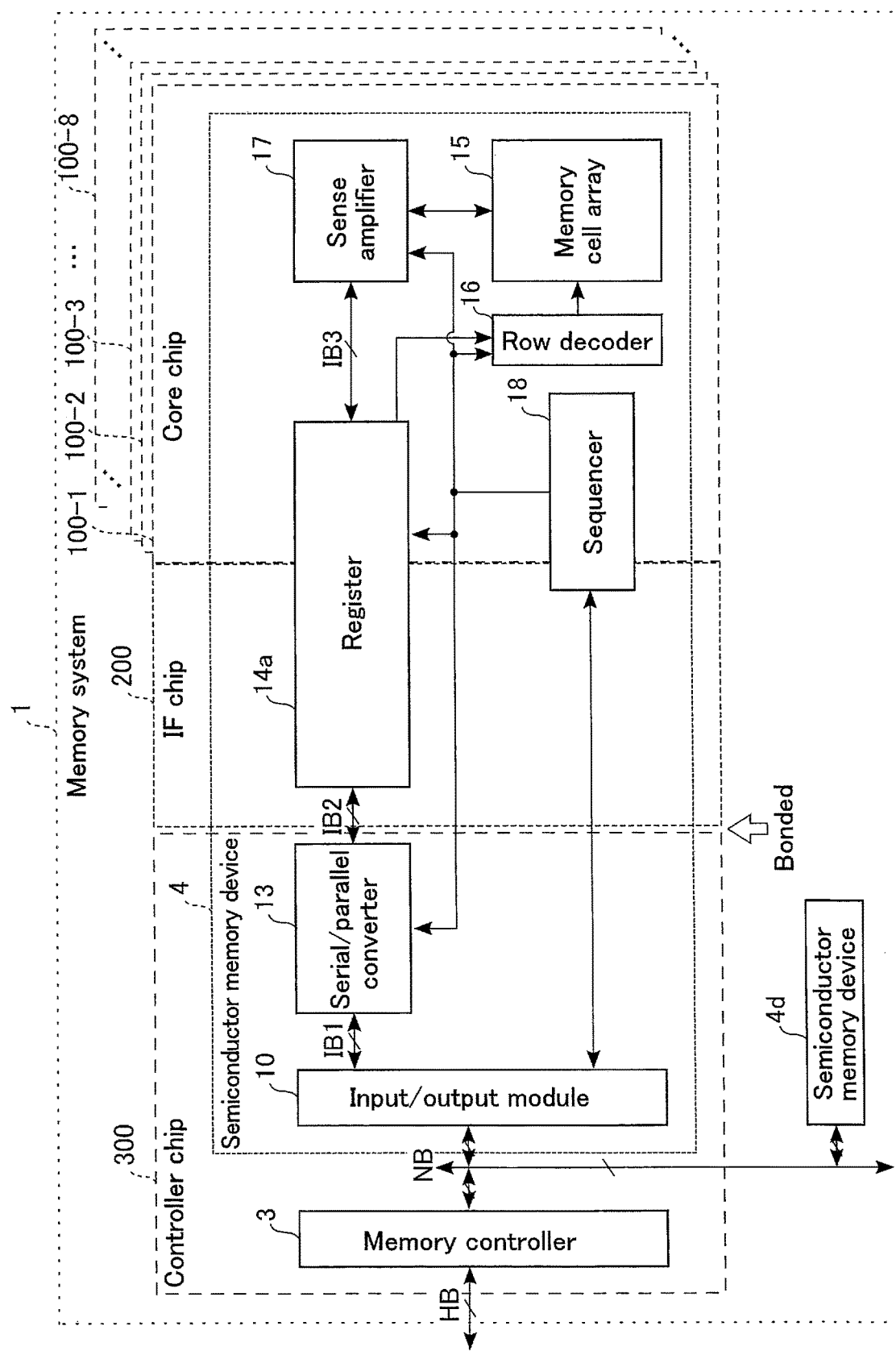
FIG. 19 is a block diagram showing an example of an arrangement of components of a memory system according to a fifth modification of the second embodiment.

FIG. 19 shows an example of an arrangement of components of a memory system 1 according to the fifth modification of the second embodiment. As shown in FIG. 19, the memory system 1 according to the fifth modification of the second embodiment differs from the memory system 1 according to the fourth modification of the second embodiment in that the NAND bus NB is provided to the outside of the controller chip 300 and in that a semiconductor memory device 4d is additionally included.

In the memory system 1 according to the fifth modification of the second embodiment, the NAND bus NB is provided continuously inside and outside the controller chip 300. The NAND bus NB is coupled to the semiconductor memory device 4d outside the controller chip 300. The semiconductor memory device 4d may have any configuration as long as operations, such as data storing and data reading, may be executed based on a command received from the memory controller 3 through the NAND bus NB. For example, the semiconductor memory device 4d may have a structure in which a plurality of substrates are overlaid and bonded together, may be formed on a single semiconductor substrate, or may have a structure in which a plurality of semiconductor substrates are stacked.

Thus, the semiconductor memory devices are coupled to the NAND bus NB, so that the storage capacity of the memory system 1 can be increased. In the fifth modification of the second embodiment described above, the semiconductor memory device 4 and the semiconductor memory device 4d are coupled to the NAND bus NB, for example. However, the number of semiconductor memory devices coupled to the NAND bus NB is not limited to two. In the memory system 1 according to the fifth modification of the second embodiment, a greater number of semiconductor memory devices may be coupled to the NAND bus NB, so that the storage capacity can be further increased.

Sixth Modification of Second Embodiment

FIG. 20 shows an example of an arrangement of components of a memory system 1 according to the sixth modification of the second embodiment. As shown in FIG. 20, the memory system 1 according to the sixth modification of the second embodiment differs from the memory system 1 according to the second embodiment in that a chip 400, a NAND interface module 33b, and a semiconductor memory device 4e are additionally included, that no serial/parallel converter is included, and that the input/output module 10 has been replaced with an input/output module 10a. Furthermore, in which chip each circuit component is disposed has been changed from the second embodiment.

In the memory system 1 according to the sixth modification of the second embodiment, the memory controller 3 includes a host interface module (HOST IF module) 31, a controller module 32, and a NAND interface module (NAND IF module) 33. The host interface module 31, the controller module 32, and the NAND interface module 33 are similar to those of the third modification of the second embodiment described above.

The IF chip 200 includes the input/output module 10a, a part of the register 14, and a part of the sequencer 18. The controller chip 300 includes the NAND interface module 33. The chip 400 includes the host interface module 31 and the controller module 32.

The register 14 of the IF chip 200 and the NAND interface module 33 of the controller chip 300 are coupled through the data bus DB. The input/output module 10a of the IF chip 200 and the NAND interface module 33 of the controller chip 300 are coupled through the logic bus LB. Functions of the input/output module 10a, the data bus DB, and the logic bus LB are respectively similar to those of the second modification of the second embodiment described above.

The IF chip 200 and the controller chip 300 are bonded together. A plurality of signal lines constituting each of the data bus DB and the logic bus LB include coupling via bonding pads.

The NAND interface module 33 of the controller chip 300 and the controller module 32 of the chip 400 are coupled through the controller bus CB. The controller bus CB is, for example, an AHB bus. The bus width of the controller bus CB is, for example, 32 bits. In the memory system 1 according to the sixth modification of the second embodiment, the controller bus CB includes, for example, a wire on the printed circuit board.

The NAND interface module 33b is coupled to the controller bus CB. The NAND interface module 33b is coupled to the semiconductor memory device 4e. The NAND interface module 33b and the semiconductor memory device 4e may have a structure in which, for example, a CMOS chip CC and a memory chip MC are bonded together, may be provided as separate chips, may be formed on one semiconductor substrate, or may include a structure in which a plurality of semiconductors are stacked. The NAND interface module 33b and the semiconductor memory device 4e may be coupled through the NAND bus or through the data bus and the logic bus.

In the memory system 1 according to the sixth modification of the second embodiment, the memory controller 3 and the register 14 are directly coupled through the data bus DB. In other words, neither a serial/parallel converter nor an input/output module is included in a signal path between the memory controller 3 and the register 14. Thus, in the memory system 1 according to the sixth modification of the second embodiment, the circuit size can be reduced and the bus width of the bus coupling the memory controller 3 and the semiconductor memory device 4 can be increased. As a result, the memory system 1 according to the sixth modification of the second embodiment can increase the communication band.

Furthermore, in the memory system 1 according to the sixth modification of the second embodiment, the chip 400 and the controller chip 300 are coupled through the controller bus CB. The controller bus CB has a wide bus width. Therefore, the memory system 1 according to the sixth modification of the second embodiment can speed up the communications between the chip 400 and the controller chip 300.

Furthermore, in the memory system 1 according to the sixth modification of the second embodiment, a plurality of sets of a NAND interface module and a semiconductor memory device are coupled to the controller bus CB. Thus, in the memory system 1 according to the sixth modification of the second embodiment, a large number of NAND interface modules and semiconductor memory devices may be provided, so that the storage capacity can be increased.

[3] Other Modifications

In the embodiments described above, the memory system 1 meets the UFS standards, for example. The standards that the memory system 1 meets are not limited to the UFS standards. For example, the host bus HB is a bus for use in serial communications. In this case, the communications performed through the host bus HB meet universal serial bus (USB) standards, serial attached SCSI (SAS) standards, or PCI express (PCIe™) standards. As another example, the host bus HB may be a UHS-I bus of SD™ card standards or a parallel communication bus that meets eMMC standards.

In this specification, a "wide" bus width means that the amount of information which the bus may transmit at a time is large. In this specification, a "narrow" bus width means that the amount of information which the bus may transmit at a time is small. For example, a bus having a 32-bit bus width is wider than a bus having an 8-bit bus width. For example, a bus having an 8-bit bus width is narrower than a bus having a 32-bit bus width.

In this specification, the term "coupling" refers to electrical coupling, and does not exclude intervention of another element. Expressions such as "electrically coupled" cover insulator-interposed coupling, which allows for the same operation as electrical coupling without an insulator.

While several embodiments have been described, these embodiments have been presented by way of example and are not intended to limit the scope of the invention. This novel embodiment may be embodied in various forms, and various omissions, replacements, and changes can be made thereon without departing from the spirit of the invention. The embodiments and modifications are included in the scope and spirit of the invention and are included in the scope of the claimed inventions and their equivalents.

The invention claimed is:

1. A memory system comprising:
a first chip including a first surface, the first chip including:
a memory cell array; and
a first bonding pad on the first surface, the first bonding pad being electrically coupled to the memory cell array, and
a second chip including a second surface, the second surface facing the first surface of the first chip, the second chip including:
a peripheral circuit configured to control the memory cell array;
an input/output module configured to transmit a signal for controlling the memory cell array to the peripheral circuit;
a memory controller configured to receive an instruction from an external host device and control a semiconductor memory device via the input/output module based on the received instruction, the semiconductor memory device including the memory cell array, the peripheral circuit, and the input/output module; and
a second bonding pad on the second surface, the second bonding pad overlapping with the first bonding pad of the first chip when seen in a thickness direction of the memory system, the second bonding pad being directly bonded with the first bonding pad of the first chip to be electrically coupled thereto, the second bonding pad further being electrically coupled to at least one of the peripheral circuit the input/output module, or the memory controller.

2. The memory system according to claim 1, further comprising:
a plurality of data lines that couple the input/output module and the memory controller, and that are used for transmission and reception of data; and
a plurality of logic lines that couple the input/output module and the memory controller, and that are used for communication of a control signal of the semiconductor memory device.

3. The memory system according to claim 2, wherein the number of the plurality of data lines is 32 or more.

4. The memory system according to claim 2, further comprising:
a switch module; and
a plurality of wires coupled to the switch module and configured to be electrically coupled to an outside of the second chip,
wherein:
the switch module is configured to electrically couple the memory controller to the plurality of wires or to electrically couple the input/output module to the plurality of wires; and
the number of the plurality of wires is equal to or smaller than a sum of the numbers of the data lines and the logic lines.

5. The memory system according to claim 2, wherein the plurality of data lines and the plurality of logic lines are configured to be electrically coupled to an outside of the second chip.

6. The memory system according to claim 1, wherein the semiconductor memory device further includes a register configured to temporarily store data to be written in the memory cell array and data read from the memory cell array;
the memory system further comprises:
a plurality of data lines that couple the register and the memory controller, and that are used for transmission and reception of data; and
a plurality of logic lines that couple the input/output module and the memory controller, and that are used for communication of a control signal of the semiconductor memory device.

7. The memory system according to claim 6, wherein the number of the plurality of data lines is 64 or more.

8. The memory system according to claim 1, wherein the memory controller includes a host interface circuit configured to be connected to the external host device.

9. The memory system according to claim 8, wherein the host interface circuit is configured to perform serial communications.

10. The memory system according to claim 1, wherein:
the peripheral circuit includes
a register; and
a sequencer configured to perform a read operation and a write operation to a memory cell included in the memory cell array based on a command stored in the register; and
the memory controller is configured to transmit the command based on the received instruction to the input/output module.

11. The memory system according to claim 1, further comprising:
a substrate; and
a package accommodating the first chip and the second chip, Wherein:
the second bonding pad of the second chip is bonded with the first bonding pad of the first chip without a wire on the substrate.

12. The memory system according to claim 1, wherein:
the first chip and the second chip are produced by different processes.

13. The memory system according to claim 1, wherein:
the second chip includes a plurality of bonding pads including at least the second bonding pad, the plurality of bonding pads are arranged in a first row and a second row on the second surface, and
the second row is located closer to the center of the second chip than the first row is, and the second row includes the second bonding pad.

14. The memory system according to claim 1, wherein:
the first chip includes a plurality of bonding pads including at least the first bonding pad,
the second chip includes a plurality of bonding pads including at least the second bonding pad,
the plurality of bonding pads of the first chip and the plurality of bonding pads of the second chip are bonded to implement a first data bus having a first width between the first chip and the second chip, and
the second chip further includes a second data bus having a second width between the input/output module and the memory controller, the second width being narrower than the first width.

15. The memory system according to claim 1, wherein:
the memory controller is further configured to control an external semiconductor memory device via a first data bus having a first width, and
the second chip further includes a second data bus having a second width between the input/output module and the memory controller, the second width being wider than the first width.

16. A memory system comprising:
a first chip including a first surface, the first chip including:
an input/output module; and
a first bonding pad on the first surface, the first bonding pad being electrically coupled to the input/output module,
a second chip including a second surface, the second surface facing the first surface of the first chip, the second chip including:
a memory controller configured to receive an instruction from an external host device and to transmit a signal for controlling a semiconductor memory device to the input/output module based on the received instruction, the semiconductor memory device including a plurality of memory cell arrays and the input/output module; and
a second bonding pad on the second surface, the second bonding pad overlapping with the first bonding pad of the first chip when seen in a thickness direction of the memory system, the second bonding pad being directly bonded with the first bonding pad of the first chip to be electrically coupled thereto, the second bonding pad further being electrically coupled to the memory controller, and
a plurality of third chips that are stacked and electrically coupled to the first chip,
the plurality of third chips respectively including the plurality of memory cell arrays.

17. The memory system according to claim 16, wherein:
the first chip includes a plurality of bonding pads including at least the first bonding pad on the first surface;
the second chip includes a plurality of bonding pads including at least the second bonding pad on the second surface; and
the input/output module and the memory controller are coupled to each other through a plurality of wires including the plurality of bonding pads of the first chip and the plurality of bonding pads of the second chip.

18. The memory system according to claim 17, wherein the plurality of wires includes:
a plurality of data lines that couple the input/output module and the memory controller, and that are used for transmission and reception of data; and
a plurality of logic lines that couple the input/output module and the memory controller, and that are used for communication of a control signal of the semiconductor memory device,
the number of the plurality of data lines being 32 or more.

19. The memory system according to claim 16, wherein the memory controller includes a host interface circuit configured to be connected to the external host device.

20. The memory system according to claim 19, wherein the host interface circuit is configured to perform serial communications.

21. The memory system according to claim 16, wherein:
the memory controller is configured to transmit command based on e received instruction to the input/output module; and
the first chip further includes:
a register configured to store the command; and
a sequencer configured to perform a read operation and a write operation to a memory cell included in the memory cell array based on the command stored in the register.

22. The memory system according to claim 16, further comprising:
a substrate; and
a package accommodating the first chip, the second chip, and the plurality of third chips, wherein:
the second bonding pad of the second chip is bonded with the first bonding pad of the first chip without a wire on the substrate.

23. The memory system according to claim 16, wherein:
the second chip and each of the plurality of third chips are produced by different processes.

24. The memory system according to claim 16, wherein:
the second chip includes a plurality of bonding pads including at least the second bonding pad, the plurality of bonding pads are arranged in a first row and a second row on the second surface, and
the second row is located closer to the center of the second chip than the first row is, and the second row includes the second bonding pad.

25. The memory system according to claim 16, wherein:
the first chip includes a plurality of bonding pads including at least the first bonding pad,
the second chip includes a plurality of bonding pads including at least the second bonding pad,
the plurality of bonding pads of the first chip and the plurality of bonding pads of the second chip are bonded to implement a first data bus having a first width between the input/output module and the memory controller, and
the memory controller is further configured to control an external semiconductor memory device via a second data bus having a second width, the second width being narrower than the first width.

26. A memory system comprising:
a first chip including a first surface, the first chip including:
an input/output module; and
a first bonding pad on the first surface, the first bonding pad being electrically coupled to the input/output module,
a second chip including a second surface, the second surface facing the first surface of the first chip,
the second chip being configured to receive an instruction from an external host device and to transmit a command to the first chip based on the received instruction;
the second chip including a second bonding pad on the second surface, the second bonding pad overlapping with the first bonding pad of the first chip when seen in a thickness direction of the memory system, the second bonding pad being directly bonded with the first bonding pad of the first chip to be electrically coupled thereto, and
a plurality of third chips electrically coupled to the first chip and each including a memory cell array,
wherein the plurality of third chips are stacked and electrically coupled to one another via through silicon vias.

27. The memory system according to claim 26, wherein the first chip, the second chip, and the plurality of third chips are sealed with resin in a package.

28. The memory system according to claim 26, wherein:
the second chip is configured to transmit the command based on the received instruction to the input/output module; and
the first chip further includes:
a register configured to store the command; and
a sequencer configured to perform a read operation and a write operation to a memory cell included in the memory cell array based on the command stored in the register.

29. The memory system according to claim 26, further comprising:
a substrate; and
a package accommodating the first chip, the second chip, and the plurality of third chips, wherein:
the second bonding pad of the second chip is bonded with the first bonding pad of the first chip without a wire on the substrate.

30. The memory system according to claim 26, wherein:
the second chip and each of the plurality of third chips are produced by different processes.

31. The memory system according to claim 26, wherein:
the second chip includes a plurality of bonding pads including at least the second bonding pad, the plurality of bonding pads are arranged in a first row and a second row on the second surface, and
the second row is located closer to the center of the second chip than the first row is, and the second row includes the second bonding pad.

32. The memory system according to claim 26, wherein:
the first chip includes a plurality of bonding pads including at least the first bonding pad,
the second chip includes a plurality of bonding pads including at least the second bonding pad,
the plurality of bonding pads of the first chip and the plurality of bonding pads of the second chip are bonded to implement a first data bus having a first width between the input/output module and the second chip, and
the second chip is further configured to control an external semiconductor memory device via a second data bus having a second width, the second width being narrower than the first width.

* * * * *